(12) United States Patent
Buchwald

(10) Patent No.: US 11,231,741 B1
(45) Date of Patent: Jan. 25, 2022

(54) SYSTEMS AND METHODS FOR GENERATING CLOCK SIGNALS

(71) Applicant: MARVELL ASIA PTE, LTD., Singapore (SG)

(72) Inventor: Aaron Buchwald, Newport Coast, CA (US)

(73) Assignee: MARVELL ASIA PTE, LTD., Singapore (SG)

( * ) Notice: Subject to any disclaimer, the term of this patent is extended or adjusted under 35 U.S.C. 154(b) by 0 days.

(21) Appl. No.: 16/158,153

(22) Filed: Oct. 11, 2018

(51) Int. Cl.
*G06F 1/08* (2006.01)
*H03L 7/07* (2006.01)

(52) U.S. Cl.
CPC . *G06F 1/08* (2013.01); *H03L 7/07* (2013.01)

(58) Field of Classification Search
CPC ..... H03L 7/06; H03L 7/07; H03L 7/08; H03L 7/0805; H03L 7/0816; H03L 7/0818; H03L 7/083; H03L 7/087; H03L 7/091; H03L 7/099; H03L 7/0991; H03L 7/0992; H03L 7/0993; H03L 7/145; H03L 7/146; H03L 7/148; H03L 7/16; H03L 7/18; H03L 7/22; H03L 7/23; H03L 7/24; G06F 1/08; G06F 1/10; G06F 1/12
USPC ............ 375/326, 327, 372, 373, 375, 376; 327/144–147, 151, 155, 156, 160; 713/500, 502, 503
See application file for complete search history.

(56) References Cited

U.S. PATENT DOCUMENTS

| | | | | |
|---|---|---|---|---|
| 5,095,262 A | * | 3/1992 | Henley | G01R 31/31922 324/73.1 |
| 8,558,728 B1 | * | 10/2013 | Lemkin | G01R 31/31709 341/166 |
| 8,779,812 B1 | * | 7/2014 | Kavanagh | H03L 7/087 327/150 |
| 2003/0052997 A1 | * | 3/2003 | Renner | H03L 7/087 348/536 |
| 2004/0001600 A1 | * | 1/2004 | Kim | H03L 7/081 381/100 |
| 2005/0289379 A1 | * | 12/2005 | Teutsch | G01S 7/282 713/400 |
| 2007/0057830 A1 | * | 3/2007 | Wiesbauer | H03L 7/18 341/126 |
| 2011/0304365 A1 | * | 12/2011 | Bunch | H03L 7/1976 327/157 |
| 2013/0058437 A1 | * | 3/2013 | Oshima | H03M 1/0836 375/316 |
| 2013/0257494 A1 | * | 10/2013 | Nikaeen | H03L 7/06 327/156 |
| 2013/0300470 A1 | * | 11/2013 | Mohajeri | H03L 7/0814 327/157 |

(Continued)

Primary Examiner — Young T. Tse

(57) ABSTRACT

The present invention is directed to electrical circuits. More specifically, embodiments of the present invention provide a clock generator that includes a source clock generates a source clock signal at a low frequency. A clock multiplier multiplies the source clock signal by a predetermined factor to generate a high frequency clock signal. The high frequency clock signal is corrected by a time adjustment module by applying a compensation signal. The compensation signal is determined by a jitter measurement module, which uses both the high frequency clock signal and a jitter reference signal to determine the compensation signal. There are other embodiments as well.

17 Claims, 34 Drawing Sheets

(56) References Cited

U.S. PATENT DOCUMENTS

2014/0198884 A1* 7/2014 Yao ................... H04L 27/0014
                                                      375/344
2016/0182065 A1* 6/2016 Wicpalek ............. H03L 7/085
                                                      327/156
2016/0352506 A1* 12/2016 Huang ............... H04L 27/2272

* cited by examiner

SYSTEMS AND METHODS FOR GENERATING CLOCK SIGNALS

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to electrical circuits.

Clock signals are used in a wide range of applications. By locking onto clock signals, digital circuits can be synchronized for various operations. Typically, a clock signal oscillates between a high state and a low state, and it is often in the form of square wave with 50% duty cycle. Digital circuits can use rising and/or falling edges of clock signals for synchronization. It is generally desirable to have a stable clock signal that oscillates at a predetermined frequency.

Over the past, there have been various types of devices for clock signal generation. Unfortunately, they are inadequate for the reasons explained below. Therefore, new and improved systems and methods for generating clocks signals are desired.

BRIEF SUMMARY OF THE INVENTION

The present invention is directed to electrical circuits. More specifically, embodiments of the present invention provide a clock generator that includes a source clock that generates a clock signal at a low frequency. A clock multiplier multiplies the source clock signal by a predetermined factor to generate a high frequency clock signal. The high frequency clock signal is corrected by a time adjustment module by applying a compensation signal. The compensation signal is determined by a jitter measurement module, which uses both the high frequency clock signal and a jitter reference signal to determine the compensation signal. There are other embodiments as well.

According to an embodiment, the present invention provides a clock generator device, which includes a source clock that is configured to generate a reference clock signal. The reference clock signal is typically characterized by a frequency of less than 40 MHz. The device further includes a clock multiplier that is configured to generate a multiplied clock signal by multiplying the reference clock signal by a factor of n, which is at least 20. The device additionally includes a jitter measurement module coupled to the clock multiplier module. The jitter measurement module is configured to generate a compensation signal by sampling the jitter associated with the multiplied clock signal and by using a jitter reference signal, which can be implicit and based on statistics. The jitter measurement module is configured to operate at a lower frequency, which is lower than the multiplied clock signal by a factor of K. The device also includes an adjustment module coupled to the clock multiplier and the jitter measurement module. The adjustment module being configured to generate a corrected clock signal using the multiplied clock signal and the compensation signal.

According to another embodiment, the present invention provides a clock generator device that has a source clock that is configured to generate a reference clock signal, which is typically characterized by a frequency of less than 40 MHz. The device also includes a clock multiplier that is configured to generate a multiplied clock signal by multiplying the reference clock signal by a factor of n, which is at least 20. The clock multiplier has a low-pass filter for removing phase noise. The clock multiplier has a voltage-controlled oscillator. The method also includes a jitter measurement module that is coupled to the clock multiplier module. The jitter measurement module is configured to generate a compensation signal by sampling the jitter associated with the multiplied clock signal and comparing it an explicit or statistically generated jitter reference signal. The jitter measurement module is configured to operate at a lowered frequency relative to the multiplied clock signal. The jitter measurement module has a high-pass filter for removing jitter associated with the voltage-controlled oscillator. The device also includes an adjustment module coupled to the clock multiplier and the jitter measurement module, the adjustment module being configured to generate a corrected clock signal using the multiplied clock signal and the compensation signal.

According to yet another embodiment, the present invention provides a clock generator device that includes a source clock being configured to generate a reference clock signal, which is characterized by a frequency of typically less than 40 MHz. The device also includes a clock multiplier that is configured to generate a multiplied clock signal by multiplying the reference clock signal by a factor of n, which is at least 20. The device further includes a jitter measurement module. The device additionally includes an adjustment module coupled to the clock multiplier and the jitter measurement module. The adjustment module is configured to generate a corrected clock signal using the multiplied clock signal and a compensation signal. The jitter measurement module is configured to generate the compensation signal by sampling the jitter associated with the corrected clock signal and comparing against a jitter reference signal. The jitter measurement module is configured to operate at lowered frequency, which is lower than the multiplied clock signal by a factor of K.

It is to be appreciated that embodiments of the present invention provide many advantages over conventional techniques. Among other things, by using a low frequency reference oscillator to generate high-frequency clock signal by multiplying clock signal, the cost and implementation of clock generators according to embodiments of the present invention are greatly improved over conventional clock generators and clock sources. Additionally, time adjustment modules remove undesirable jitter to ensure clean clock signals at operating frequencies.

Embodiments of the present invention can be implemented in conjunction with existing systems and processes. For example, clock generators can be manufactured with existing manufacturing equipment and processes. Additionally, clock generators can provide high frequency (over 1 GHz) clock signals for a wide range of applications. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed to electrical circuits. More specifically, embodiments of the present invention provide a clock generator that includes a source clock generates a source clock signal at a low frequency. A clock multiplier multiplies the source clock signal by a predetermined factor to generate a high frequency clock signal. The high frequency clock signal is corrected by a time adjustment module by applying a compensation signal. The compensation signal is determined by a jitter measurement module, which uses both the high frequency clock signal and a jitter reference signal to determine the compensation signal. There are other embodiments as well.

Figure 1:
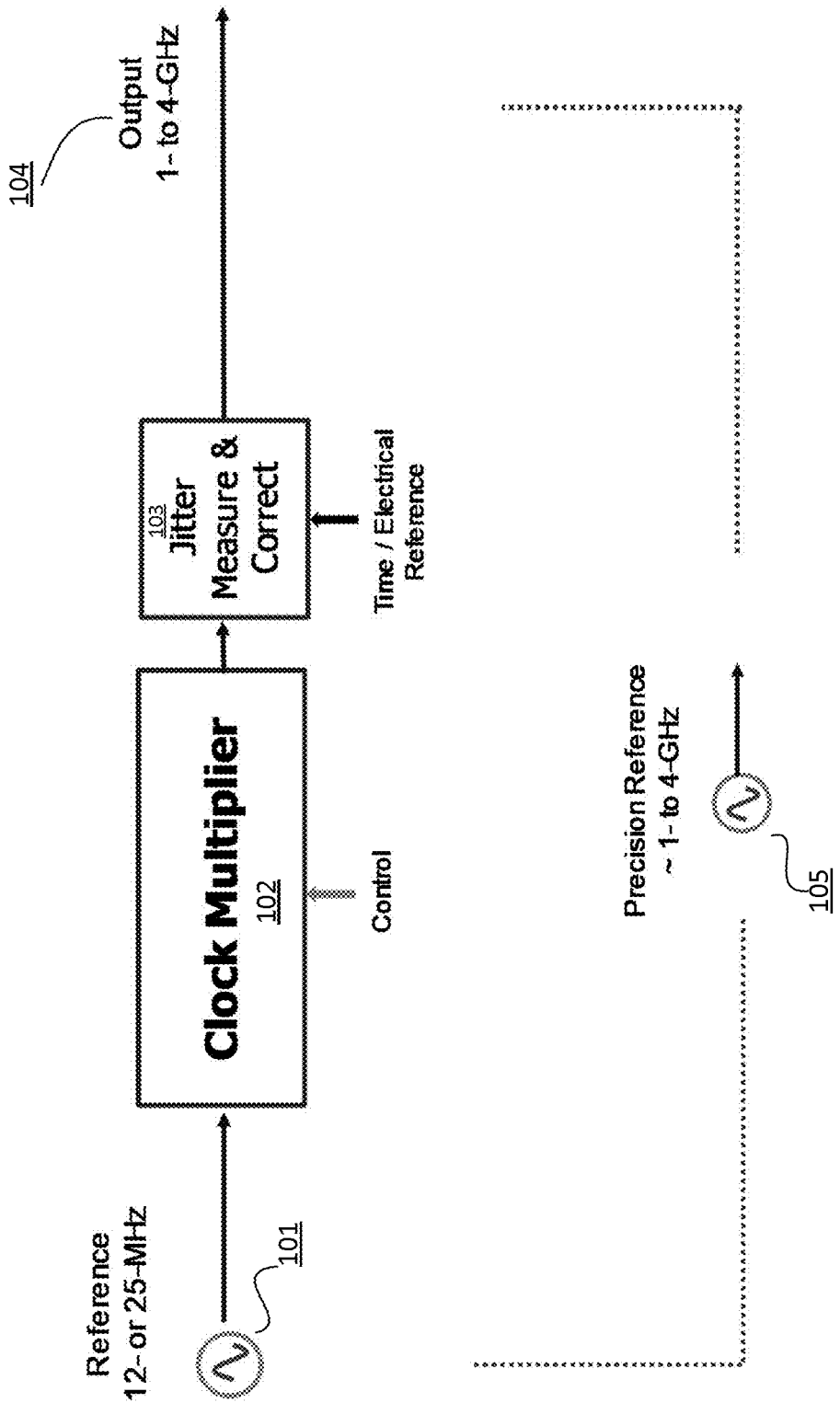
FIG. 1 is a simplified diagram illustrating a conventional clock signal source.

As explained above, conventional systems and methods for generating clock signals are inadequate. FIG. 1 is a simplified diagram illustrating a conventional clock signal source. For a desired frequency output at 1 GHz to 4 GHz, a low frequency reference clock source 101 provides a relatively low frequency signal at about 12 to 25 MHz. Typically, clock source 101 is implemented using a voltage-controlled oscillator (VCO), and the oscillating stability of the crystal limits both the precision and range of the reference clock output. The output of the clock source 101 is converted to high frequency by clock multiplier 102. The output of the clock multiplier 102 is corrected at the jitter correction module 103.

The output frequency at 1 GHz to 4 GHz is high relative to the output of the clock source 101. For example, the multiplication factor between 12 MHz and 4 GHz is over 300 times. The concatenation of blocks 101-103 act to create an effective precision source 105 with a low frequency input and precision high frequency output.

Since the multiplication factor for the clock signals from clock source 101 is high, any errors and inaccuracies from clock source 101 is multiplied. For example, a small deviation in phase at the low frequency clock source (e.g., due to electrical to temperature instability) could easily translate to a large phase error at the output 104 (although the absolute time jitter is the same). Therefore, to provide accurate high frequency output at output clock 104, the output of clock source 101 needs to be highly accurate and the oscillator in block 102 also needs to be precise. Typically, a highly accurate crystal is used to implement the clock source 101 and expensive, high power circuits used to implement 102. However, highly accurate crystals and high-quality oscillators are expensive and often impractical (e.g., size, power consumption, etc.) for actual implementation. It is therefore to be appreciated that embodiments of the present invention provide accurate and agile clock sources. For example, the term "agile" here refers to the ability of clock source to have a large frequency range.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 2A:
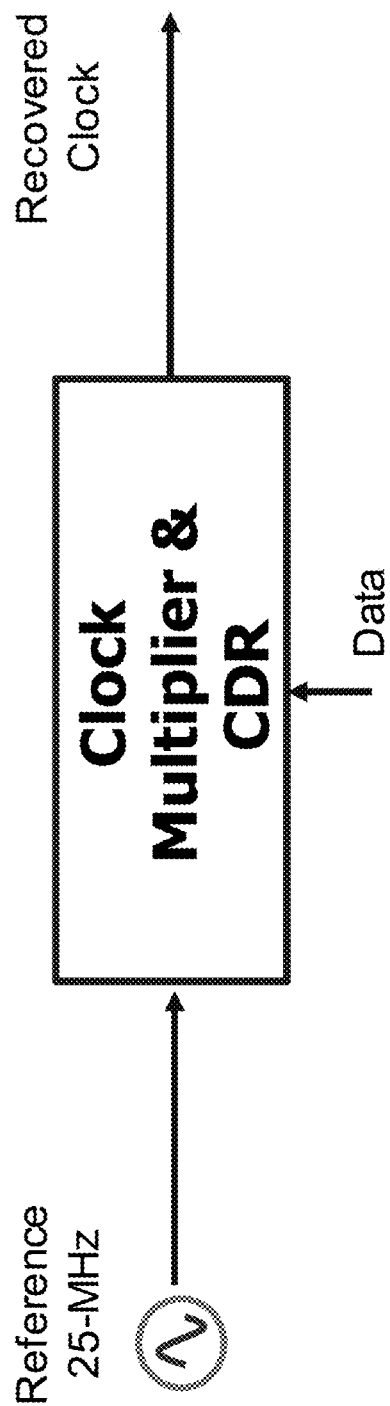
FIG. 2A is a simplified block diagram illustrating a clock generator.
Figure 2B:
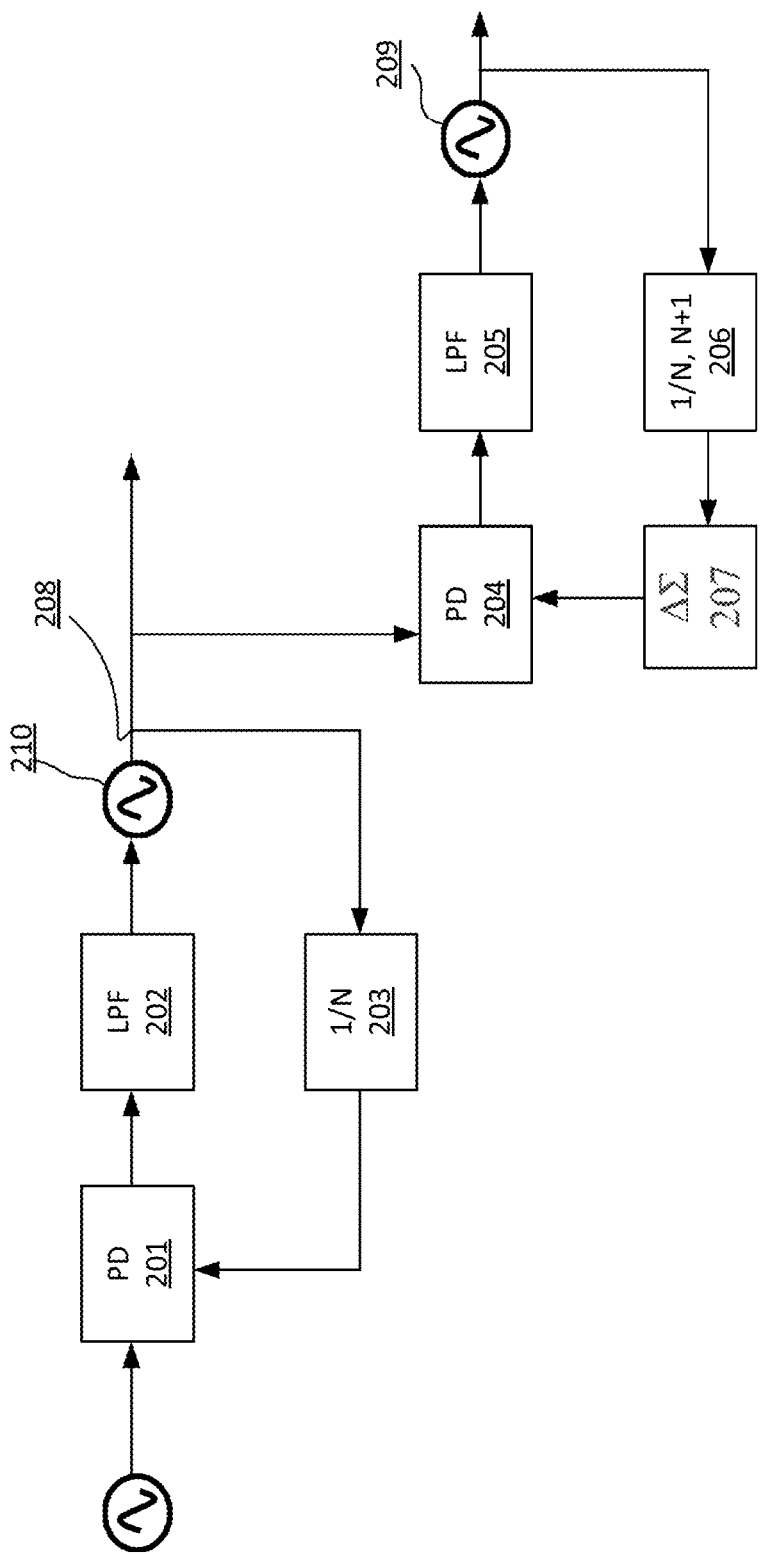
FIG. 2B is a simplified diagram illustrating a two-step clock generation system.

FIG. 2A is a simplified block diagram illustrating a clock generator. As shown in FIG. 2A, a recovered clock is provided by multiplying the input reference clock signal and performing clock data recovery based on the received data stream. FIG. 2B is a simplified diagram illustrating a two-step clock generation system. More specifically, agility and accuracy concerns are addressed in two phases. Reference clock signal is processed by the phase detection module 201 and low-pass filter (LPF) 202, and the output from the VCO 210 at node 208 is an accurate low-jitter clock signal that is used in the next step. Additionally, the signal at node 208 is processed at block 203 by a function of 1/N (i.e., divided by a factor of 1V). The signal at node 208 is processed by PD 204 and low-pass filter (LPF) 205, and a frequency-agile VCO 209 is then used. As a part of a feedback loop, the output of VCO 209 is further processed by block 206 (i.e., 1/N and N+1 functions) and block 207 (i.e., ΣΔ function). By using a two-steps implementation, both accuracy and agility can be achieved.

Figure 3:
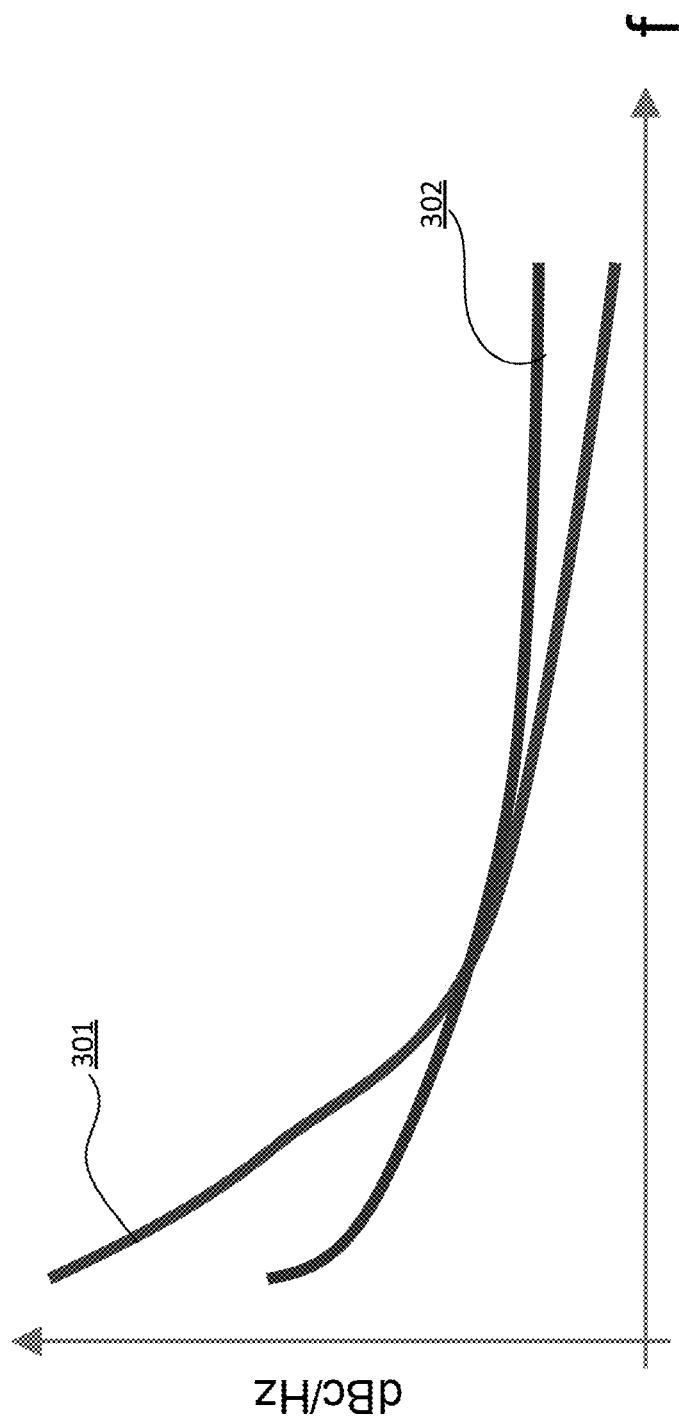
FIG. 3 is a graph illustrating performance of a clock generator system.

FIG. 3 is a graph illustrating performance of a clock generator system. Plot 301 illustrates the performance (as measured in baseband noise) of a system with conventional PLL implementation. Plot 302 illustrates performance (also measured in terms of baseband noise) of a system with jitter correction (e.g., performed by block 103 in FIG. 1). As shown in FIG. 3, plot 302 exhibit a lower level of baseband nose at low frequency, but the high frequency jitter is higher than the conventional PLL implementation at the high frequency range. For example, the suppression of low-frequency jitter often comes out at the expense of increased high-frequency jitter. It is to be noted that a low-jitter high-frequency reference is useful as it allows a wideband PLL which tracks out more of the self-jitter from the VCO.

Figure 4:
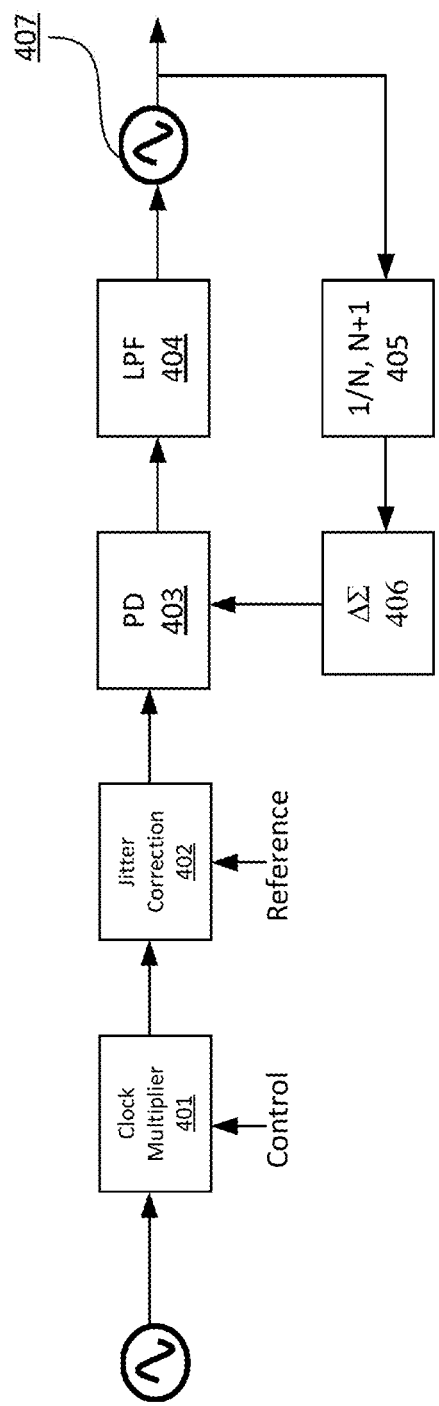
FIG. 4 is simplified diagram illustrating a clock generator.
Figure 5:
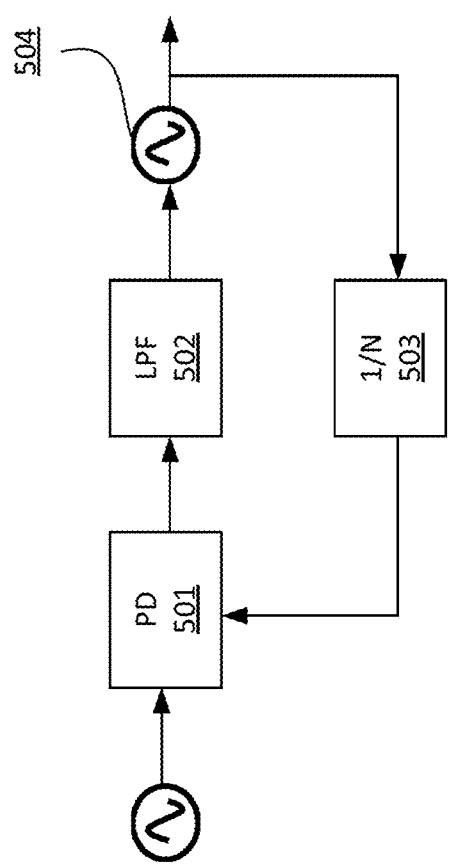
FIG. 5 is an exemplary PLL implementation that provides jitter-tracking.

FIG. 4 is simplified diagram illustrating a clock generator. The reference clock signal (e.g., at 25 MHz) is first processed by a clock multiplier 401. For example, the operation of clock multiplier 401 is dictated by a control signal, which may be generated by a system control module. Block 402 provides jitter measurement and correction. In performing jitter correction, block 402 may use one or more time and/or electrical references. Block 403 provides phase detection on the signals received from block 402, and the signals are further processed by LPF 404. Output signal generated by VCO 407 is fed into a feedback loop that involves block 405 and block 406. Block 405 performs function "1/N" and "N+1". Block 406 performs ΔΣ modulation. In various implementations, two PLLs are used. The high-frequency jitter (illustrated in FIG. 3) are blocked and rejected by a second PLL. FIG. 5 is an exemplary PLL implementation that provides jitter-tracking. Reference clock signal is processed first by phase detection block 501 and then by the LPF block 502. The output of the VCO 504 is used at input of a feedback loop that involves block 503, which provides a "1/N" function. The integer-N PLL implementation provides a jitter filtering transfer function. The challenge is to track the jitter of VCO 504 with sufficient accuracy and speed to match the reference frequency jitter.

Figure 6A:
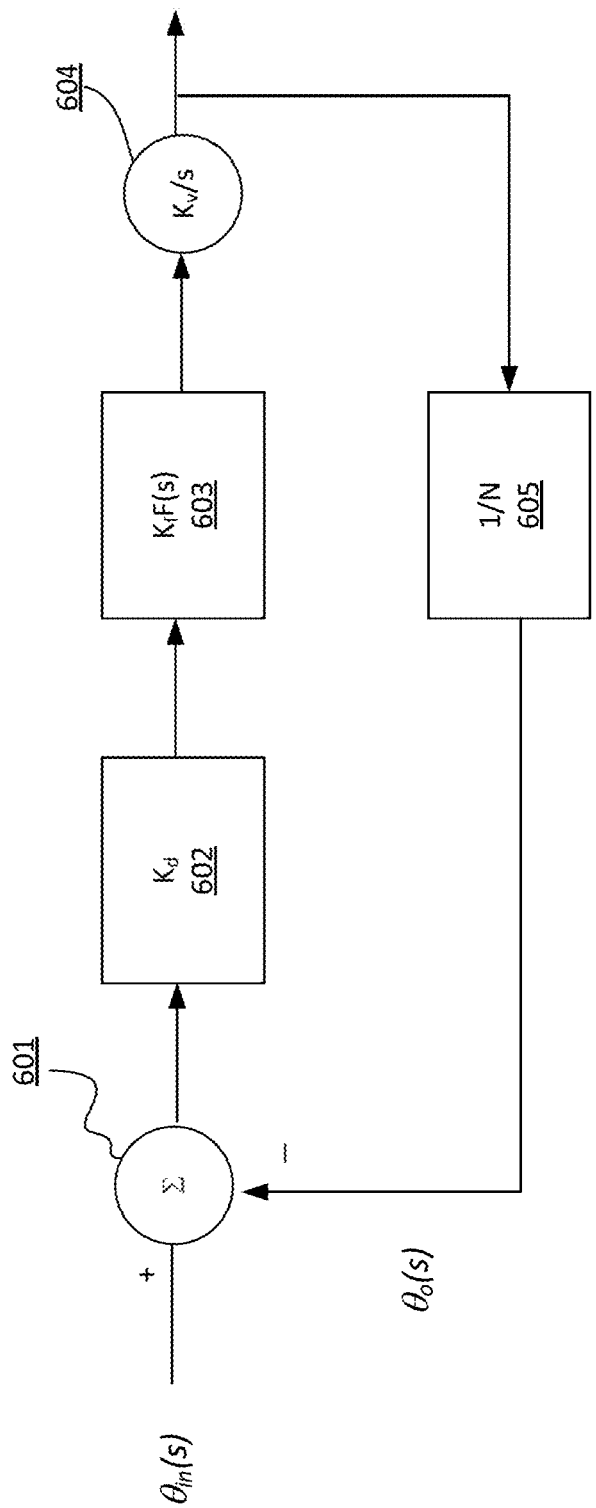
FIG. 6A is a simplified diagram illustrating operation of a clock generator.

FIG. 6A is a simplified diagram illustrating operation of a clock generator. This diagram is merely an example, which should not unduly limit the scope of the claims. One of ordinary skill in the art would recognize many variations, alternatives, and modifications. As shown in FIG. 6, input signal is expressed as $\theta_{in}(s)$, which is processed at block 602 with a gain of $K_d$ (e.g., associated with phase detector 501 in FIG. 5) and block 603 with a gain of $K_fF(s)$ (e.g., associated with the LPF 502 in FIG. 5 and is frequency dependent). The output from block 603 is associated with oscillator gain $K_v/s$ (e.g., associated with the output oscillator in FIG. 5). The output of block 604 is fed into a feedback loop and through block 605 with a function of 1/N. The signal from block 605 and into block 601 (to be subtracted) is signal $\theta_O(s)$. The gain of the system can be expression in Equation 1 below:

$$\omega_L \triangleq \frac{K_d K_f K_v}{N} = \frac{1}{\tau_L} \qquad \text{Equation 1}$$

And the loop gain can be expressed using Equation 2 below:

$$L(s) = \frac{F(s)}{s\tau_L} \qquad \text{Equation 2}$$

Based on Equation 1 and Equation 2, the system gain $H_o$ can be expressed using Equation 3 below:

$$H_o(s) = \frac{\theta_o(s)}{\theta_{in}(s)} = \frac{L(s)}{1+L(s)} = \frac{F(s)}{F(s)+s\tau_L} \qquad \text{Equation 3}$$

Equation 3 can be simplified by the following conditions wherein the integrator is slow relative to the natural loop dynamics:

$$F(s) = 1 + \frac{1}{s\tau_z} \text{ and}$$
$$\tau_z \gg \tau_L$$

With the above assumptions, the frequency response of Equation 3 can be simplified to Equation 4 below:

$$H_o(s) \sim \frac{1}{1+s\tau_L} \qquad \text{Equation 4}$$

Figure 6B:
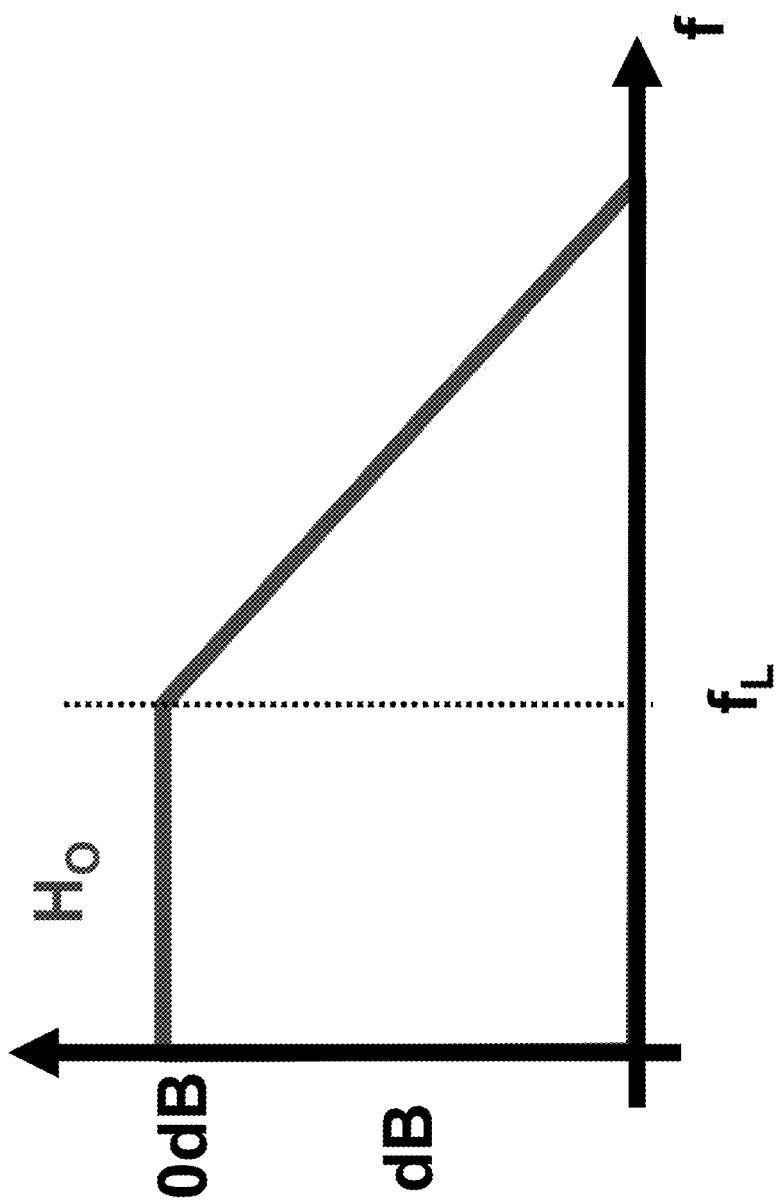
FIG. 6B is a simplified plot illustrating operation of low-pass filter function for reference phase noise.

The response of $\theta_{in}(s)$ signal is illustrated in FIG. 6B. FIG. 6B is a simplified plot illustrating operation of low-pass filter function for reference phase noise.

Figure 7A:
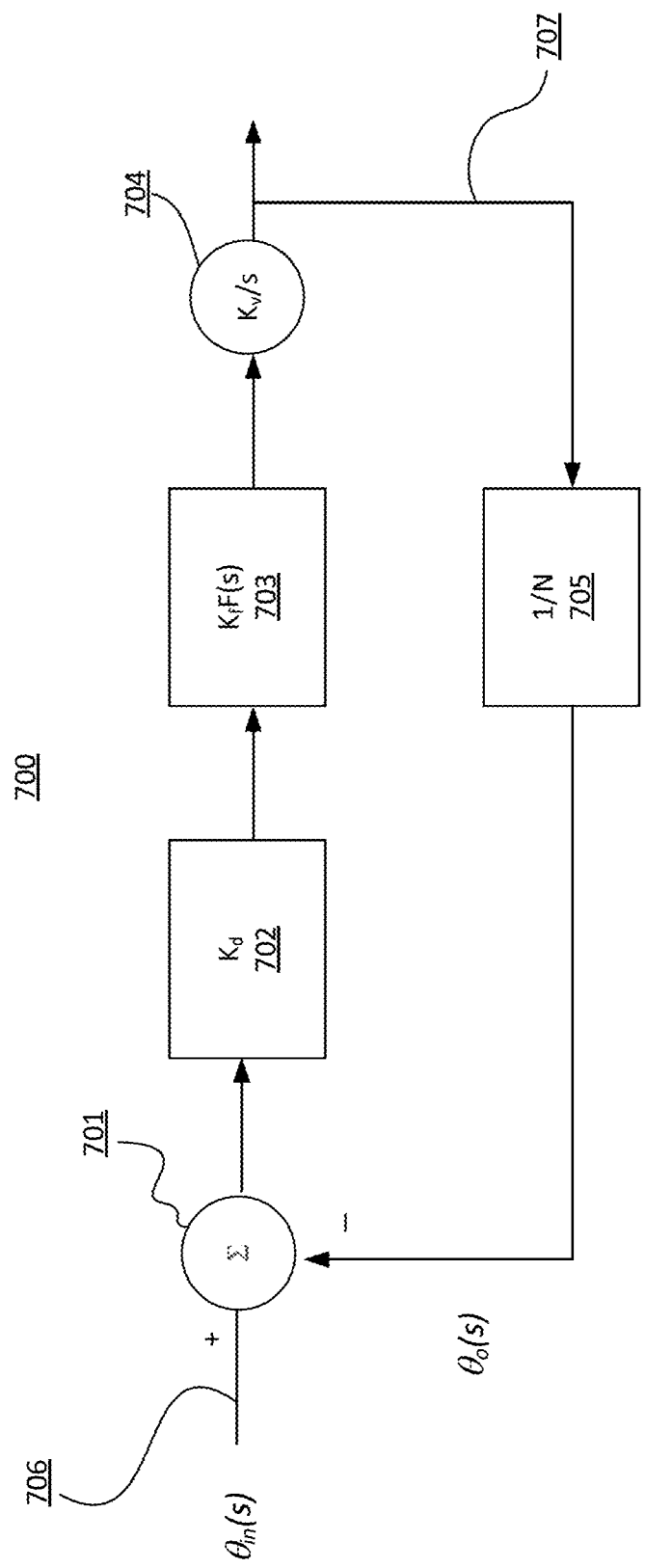
FIG. 7A-E are diagrams illustrating operation of clock generator 700.

FIG. 7A-E are diagrams illustrating operation of clock generator 700. FIG. 7A shows clock generator 700. Input signal is received at terminal 706. Block 702 provides phase detection function. Block 703 provides LPF function. Block 704 comprises a voltage-controlled oscillator. The output signal at terminal 707 is provided to block 705, which is a part of the feedback loop that generates a compensation signal to block 701.

Figure 7B:
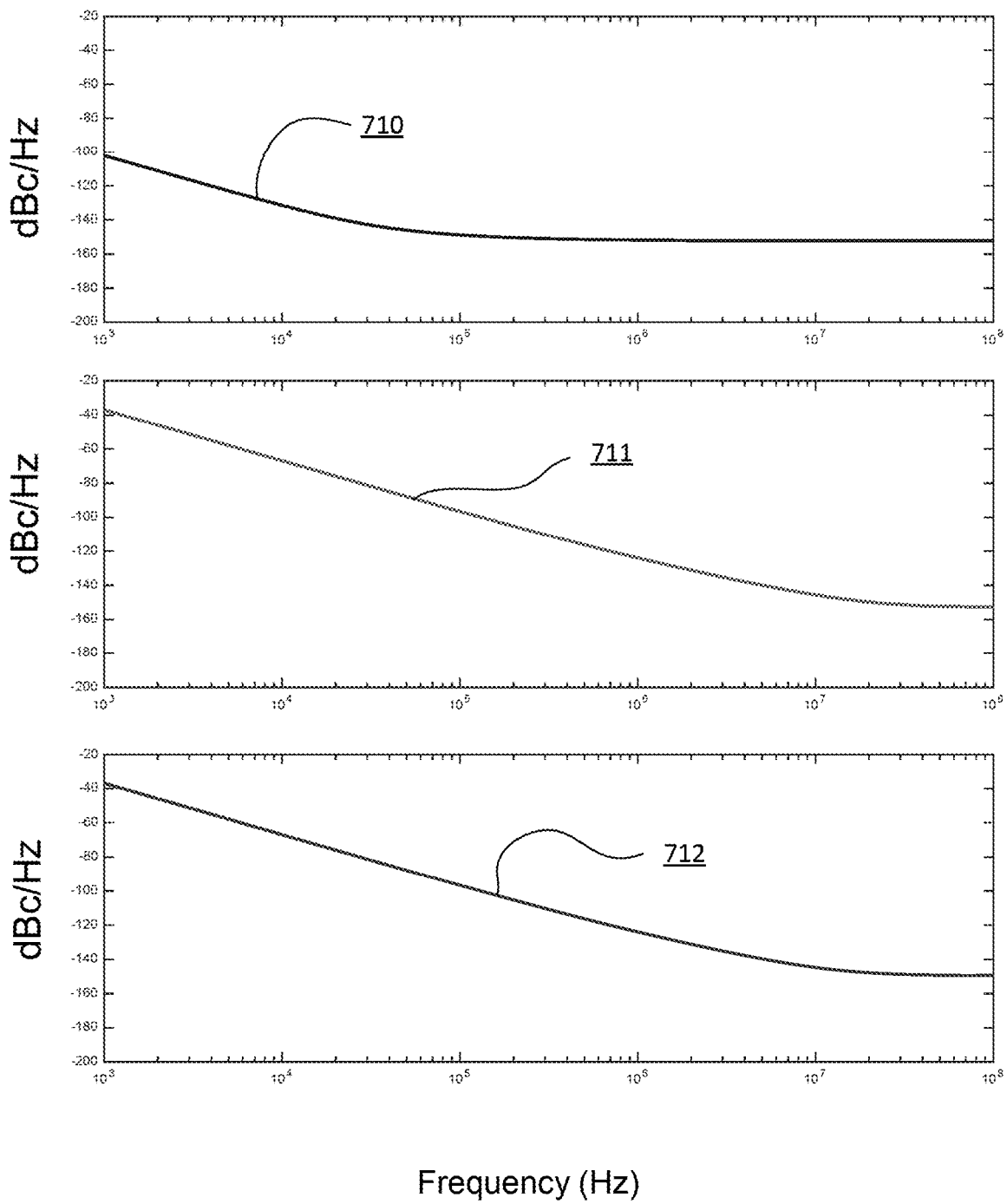

FIG. 7B provides baseband phase noised power-spectral density (PSD) graphs for a 900 MHz carrier for an output clock with no filtering. Plot 710 shows noise response associated with reference clock phase-noise (equivalent to signal that is up-converted to 900 MHz at terminal 706). Plot 711 shows open-loop VCO phase noise (e.g., at block 704). Plot 712 shows output phase noise (e.g., at terminal 707).

Figure 7C:
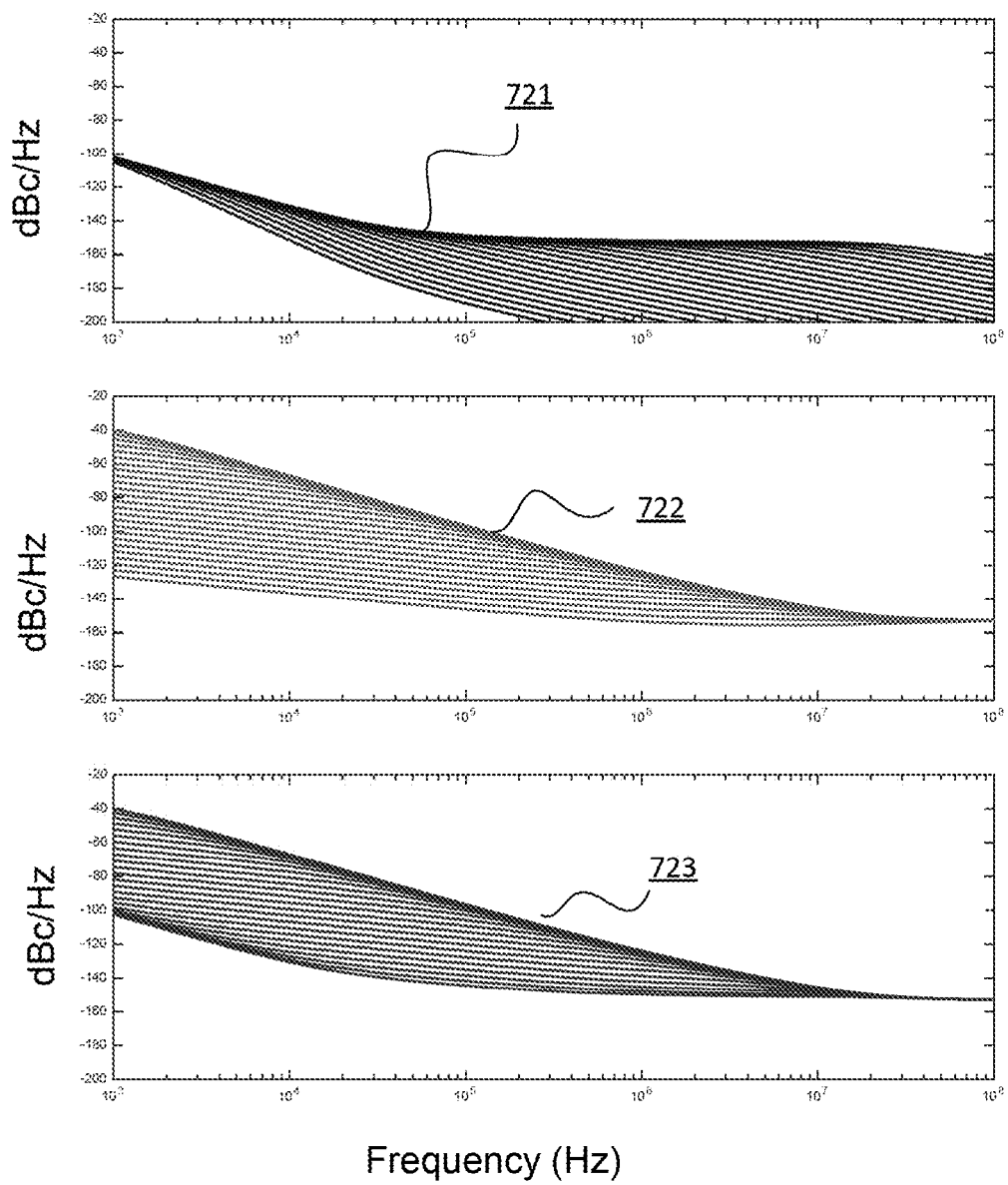

FIG. 7C provides baseband phase noised power-spectral density (PSD) graphs for a 900 MHz carrier for an output clock with filter bandwidth of 1 KHz to 30 MHz. Plot 721 shows noise response associated with reference clock phase-noise (equivalent to signal that is up-converted to 900 MHz at terminal 706). Plot 722 shows open-loop VCO phase noise (e.g., at block 704). Plot 723 shows output phase noise (e.g., at terminal 707).

Figure 7D:
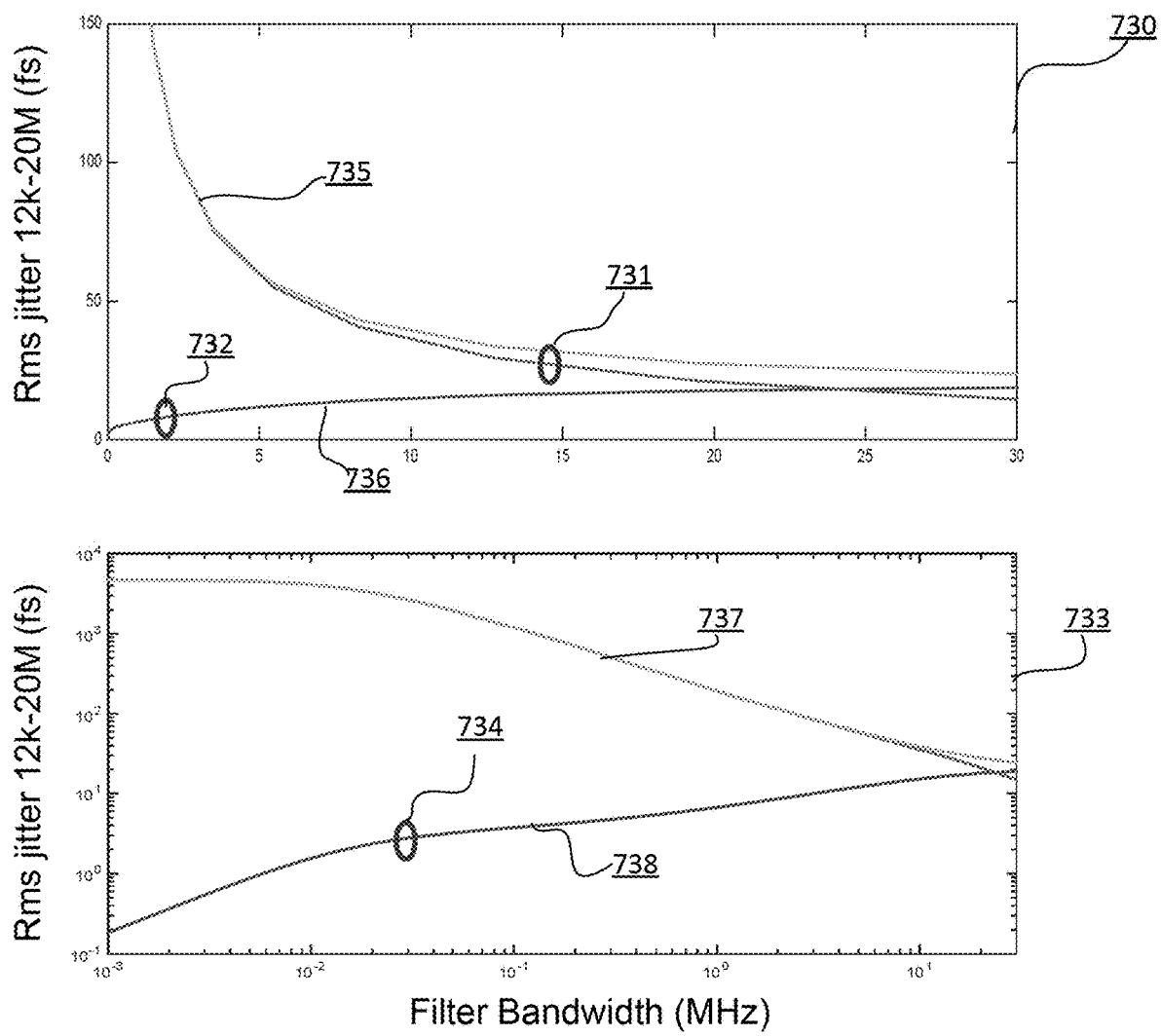

FIG. 7D provides graphs illustrating jitter at different filter bandwidth. Plot 730 and plot 731 show that jitter of the reference clock signal is low at low frequency (e.g., at point 732 and 734, and plots 736 and 738) and this jitter increases as bandwidth increases. In comparison, the jitter of the VCO (e.g., at point 731, and plots 735 and 737) becomes lower as the output bandwidth increases. It is to be noted that point 731 corresponds to a filter bandwidth of 15 MHz, which means that the bandwidth width at VCO should be preferably at least 15 MHz.

Figure 7E:
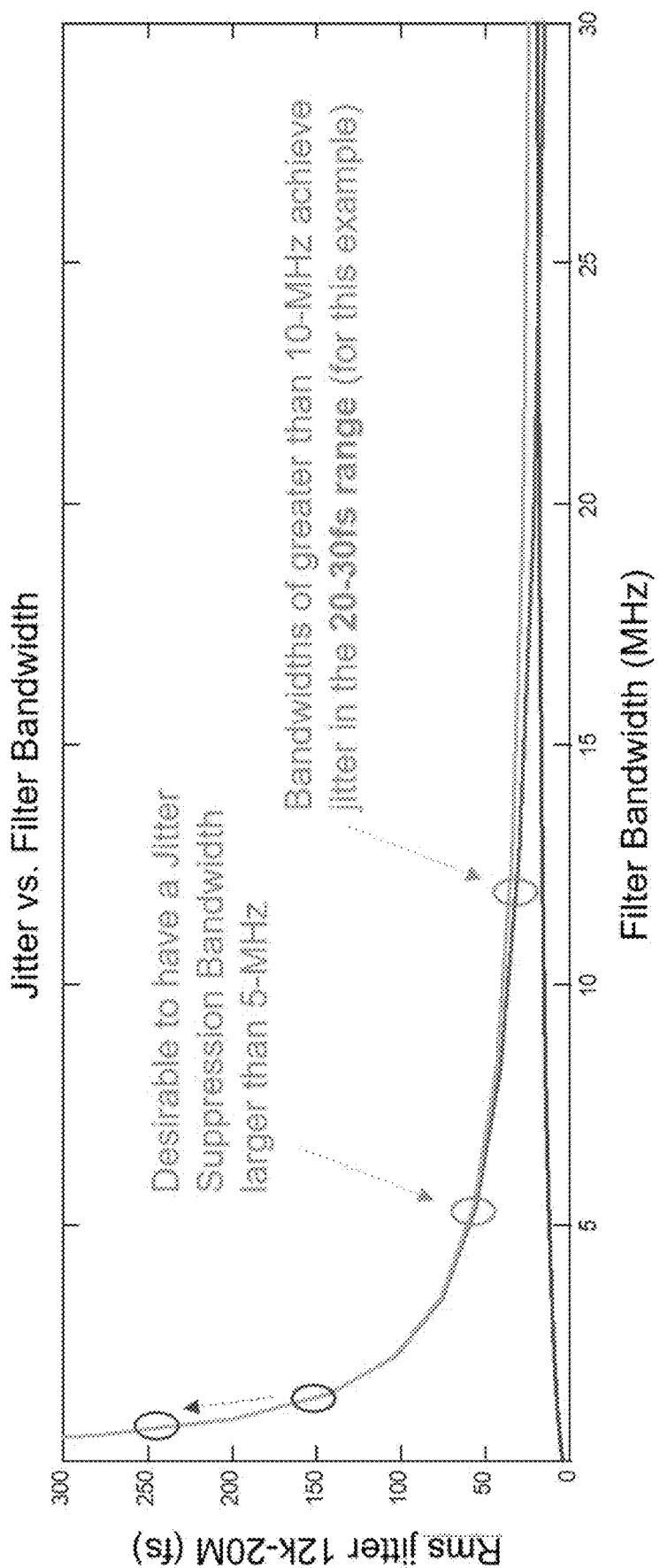

FIG. 7E illustrates relationship between jitter suppression and stability. As shown in FIG. 7E, it is desirable to have a jitter suppression bandwidth of at least 5 MHz, and bandwidth of greater than 10 MHz can achieve a jitter level in the 20 to 30 fs range in this particular example. However, loop stability and glitch-suppression requirements limit the loop bandwidth to about $f_{ref}/20$ to $f_{ref}/10$. In actual implementation, jitter is in the 150-250 fs range for practical PLL loop bandwidths.

Figure 8A:
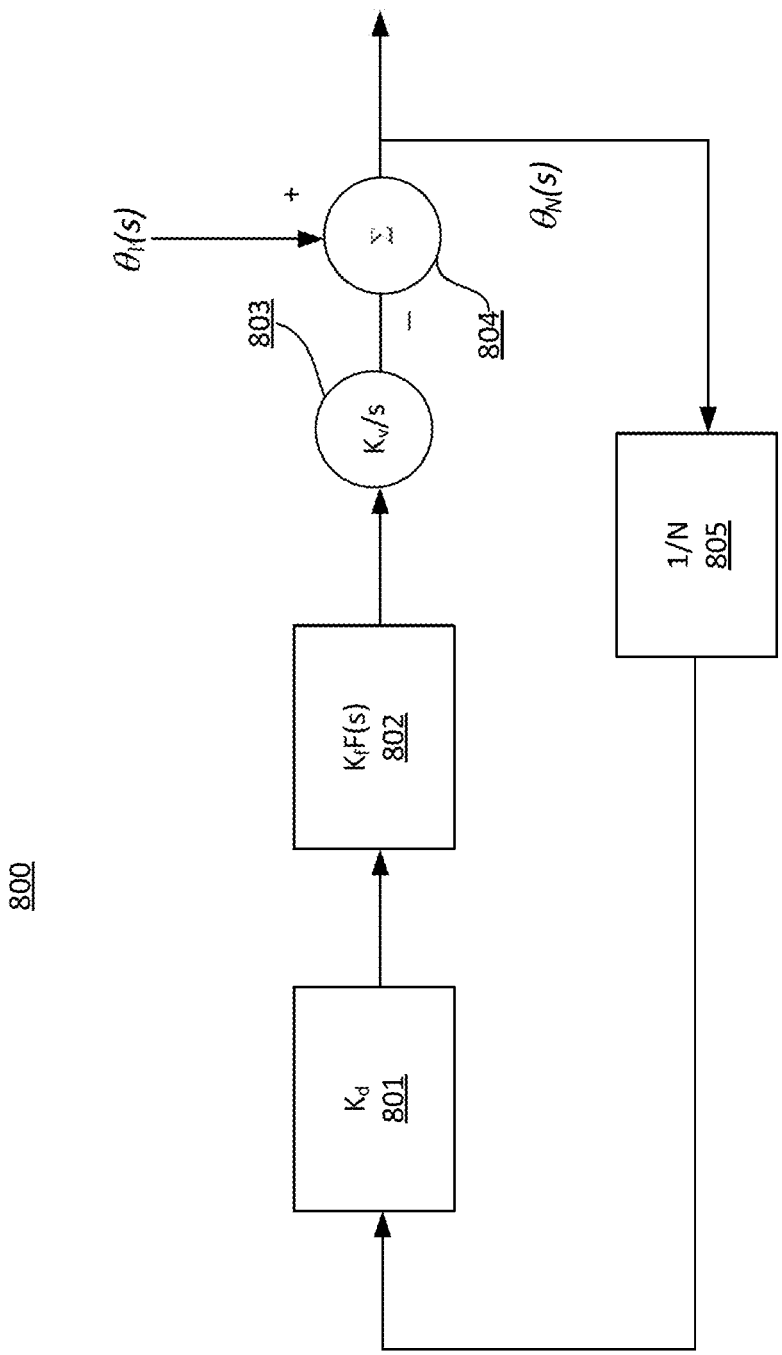
FIG. 8A is a simplified diagram illustrating operation of jitter-suppression for PLL-based clock multipliers.

FIG. 8A is a simplified diagram illustrating operation of jitter-suppression for PLL-based clock multipliers. For example, referring back to FIG. 2A, section 800 performs jitter suppression functions (e.g., starting at block 204). The input signal $\theta_v(s)$ is received at block 804, and the output signal $\theta_N(s)$ is used as a part of a feedback back loop involving blocks 805, 801, 802, and 803 as shown. The frequency response of section 620 is expressed in Equation 5 below:

$$H_e(s) = \frac{\theta_v(s)}{\theta_N(s)} = \frac{1}{1+L(s)} = \frac{s\tau_L}{F(s)+s\tau_L} \qquad \text{Equation 5}$$

By simplifying Equation 5 with the following conditions, Equation 6 can be obtained as shown below:

$$F(s) = 1 + \frac{1}{s\tau_z} \text{ And} \qquad \text{Equation 6}$$
$$\tau_z \gg \tau_L$$
$$H_e(s) \sim \frac{s\tau_L}{1+s\tau_L}$$

Figure 8B:
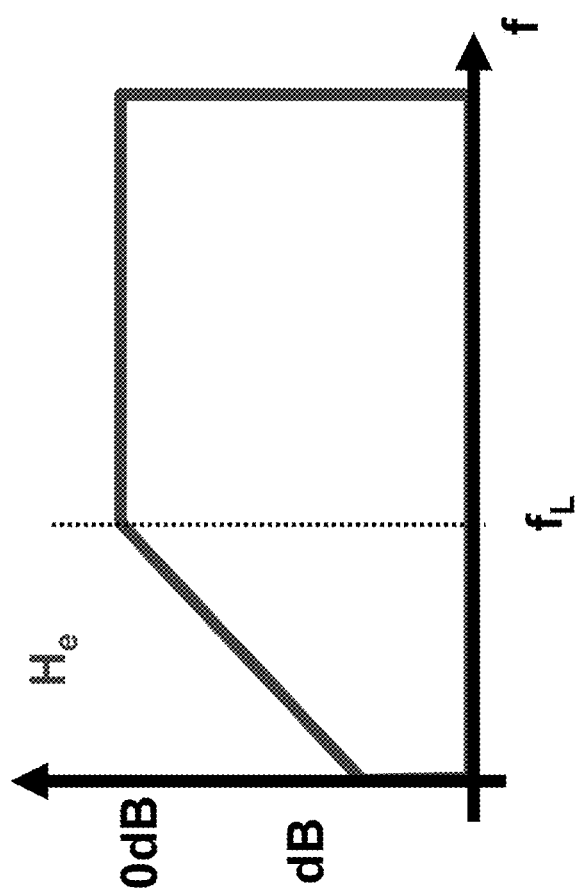
FIG. 8B is a simplified plot illustrating operation of high-pass filter function for reference phase noise.

FIG. 8B is a simplified plot illustrating operation of high-pass filter function for reference phase noise. For example, the high pass filter function is provided by the operation of the loop to suppress self-noise of the oscillator within the loops bandwidth.

Figure 9:
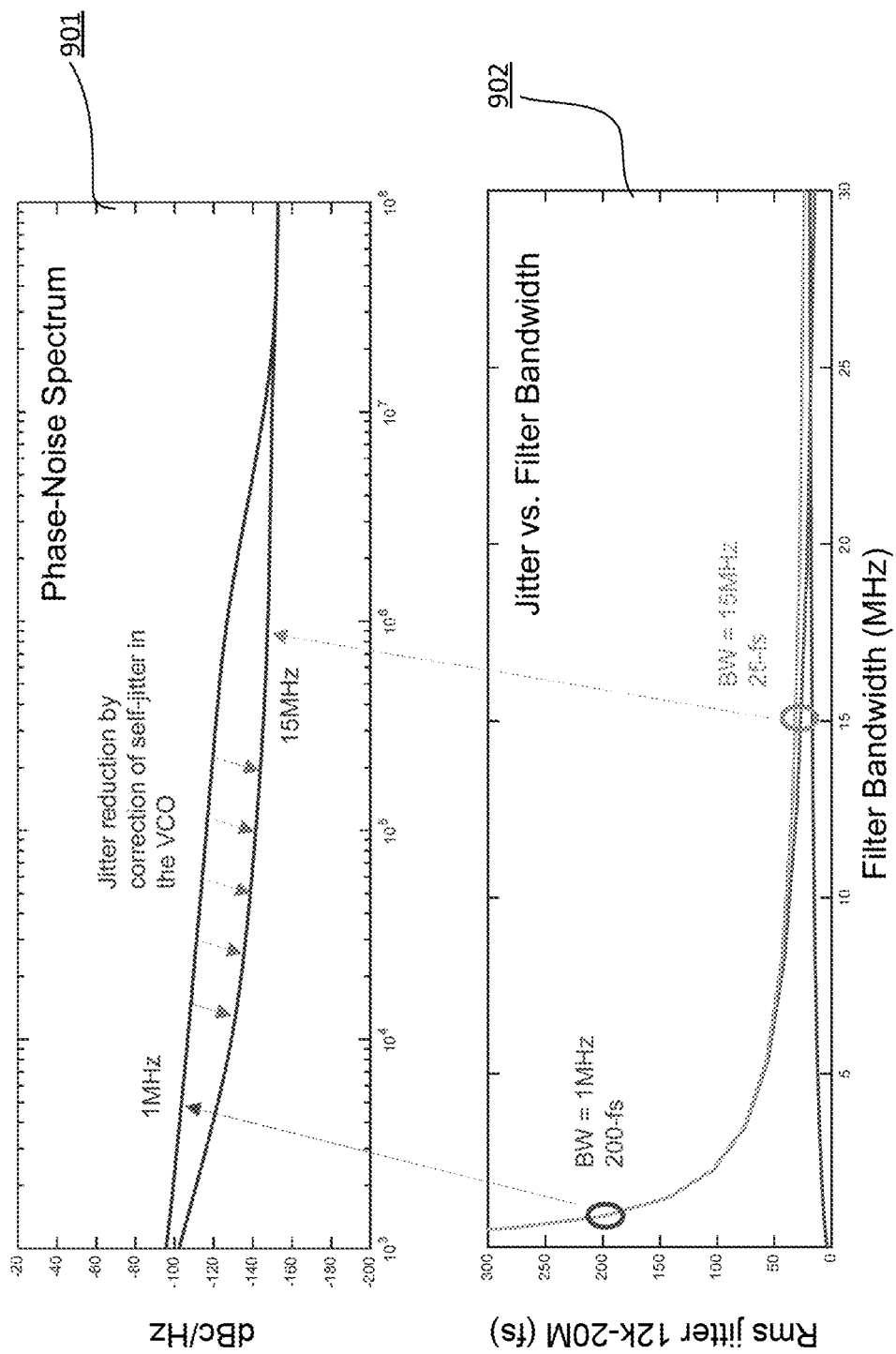
FIG. 9 illustrates a relationship between phase noise, jitter, and filter bandwidth.

FIG. 9 illustrates a relationship between phase noise, jitter, and filter bandwidth. As illustrated in plot 901, jitter is significantly reduced by increasing bandwidth from 1 MHz to 15 MHz in a case where the jitter from the VCO dominates.

Figure 10:
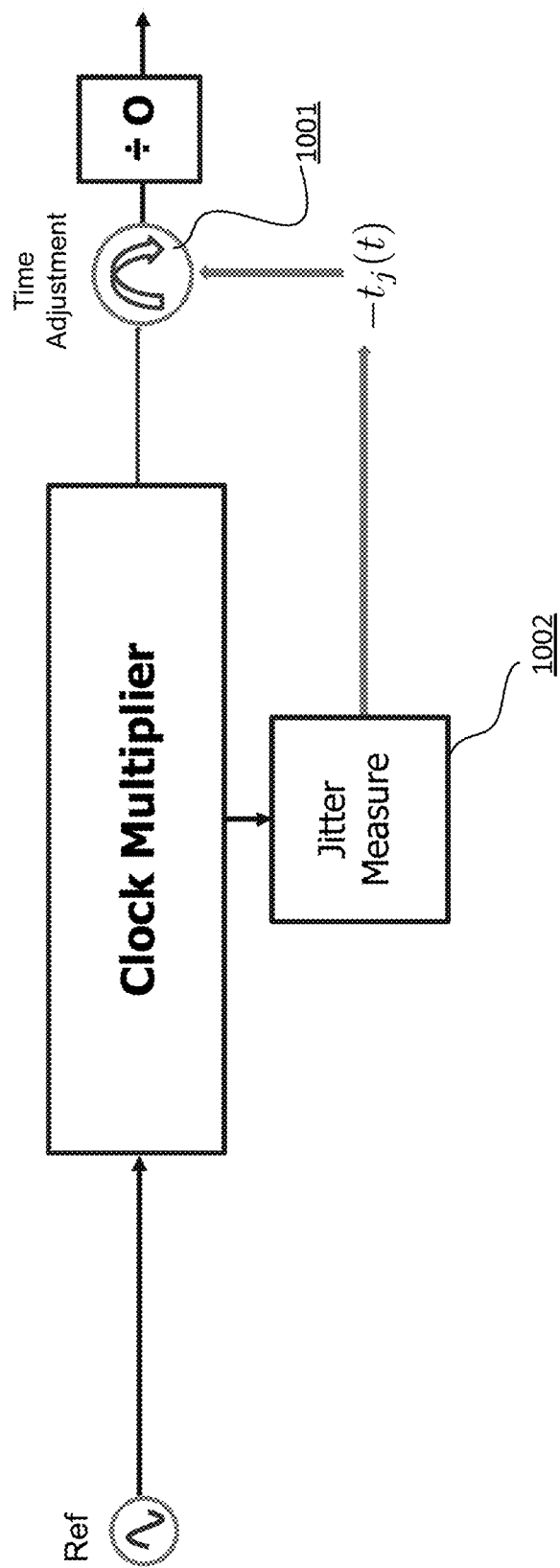
FIG. 10 is a simplified diagram illustrating a clock generator with forward compensation according to embodiments of the present invention.

FIG. 10 is a simplified diagram illustrating a clock generator with forward compensation according to embodiments of the present invention. This diagram is merely an example, which should not unduly limit the scope of the claims. One of ordinary skill in the art would recognize many variations, alternatives, and modifications. As shown in FIG. 10, a reference clock signal is processed by a clock multiplier. Block 1001 provides time adjustment of the output clock based on the jitter measurement at block 1002. For example, if jitter is estimated and subtracted in a feed-forward configuration or via an external measure-and-adjust loop, the speed of the adjustment is no longer limited by the bandwidth of the PLL loop. There high effective jitter suppression bandwidth can be achieved without impacting system stability. In various embodiments, bandwidth of the jitter suppression can be as high as the Nyquist rate of the measurement (i.e., half the reference frequency or half the jitter measurement sampling frequency if the jitter reference is not the same as input frequency reference). Depending on the implementation, time adjustment can be in the analog domain or implemented using digital to time converter (DTC) which can be linear for or rotating, such as a phase-interpolator when beat frequencies other than the output of the clock multiplier need to be synthesized.

Figure 11:
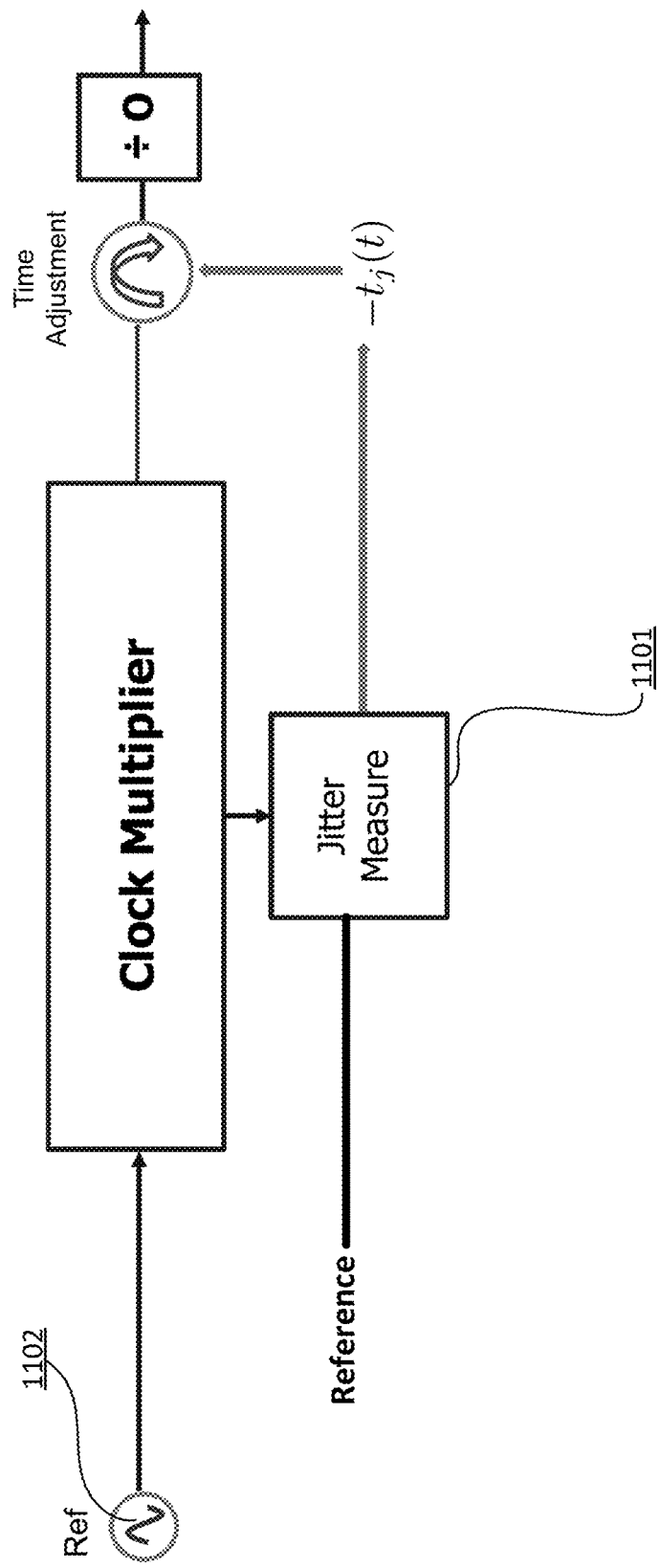
FIG. 11 is a simplified diagram illustrating a clock generator with forward compensation and a reference for jitter measurement according to embodiments of the present invention.

FIG. 11 is a simplified diagram illustrating a clock generator with forward compensation and a reference for jitter measurement according to embodiments of the present invention. This diagram is merely an example, which should not unduly limit the scope of the claims. One of ordinary skill in the art would recognize many variations, alternatives, and modifications. As shown in FIG. 11, jitter measurement block 1101 receives a reference signal for jitter measurement. For example, the reference frequency from reference clock 1102 can be used as a jitter reference.

Figure 12:
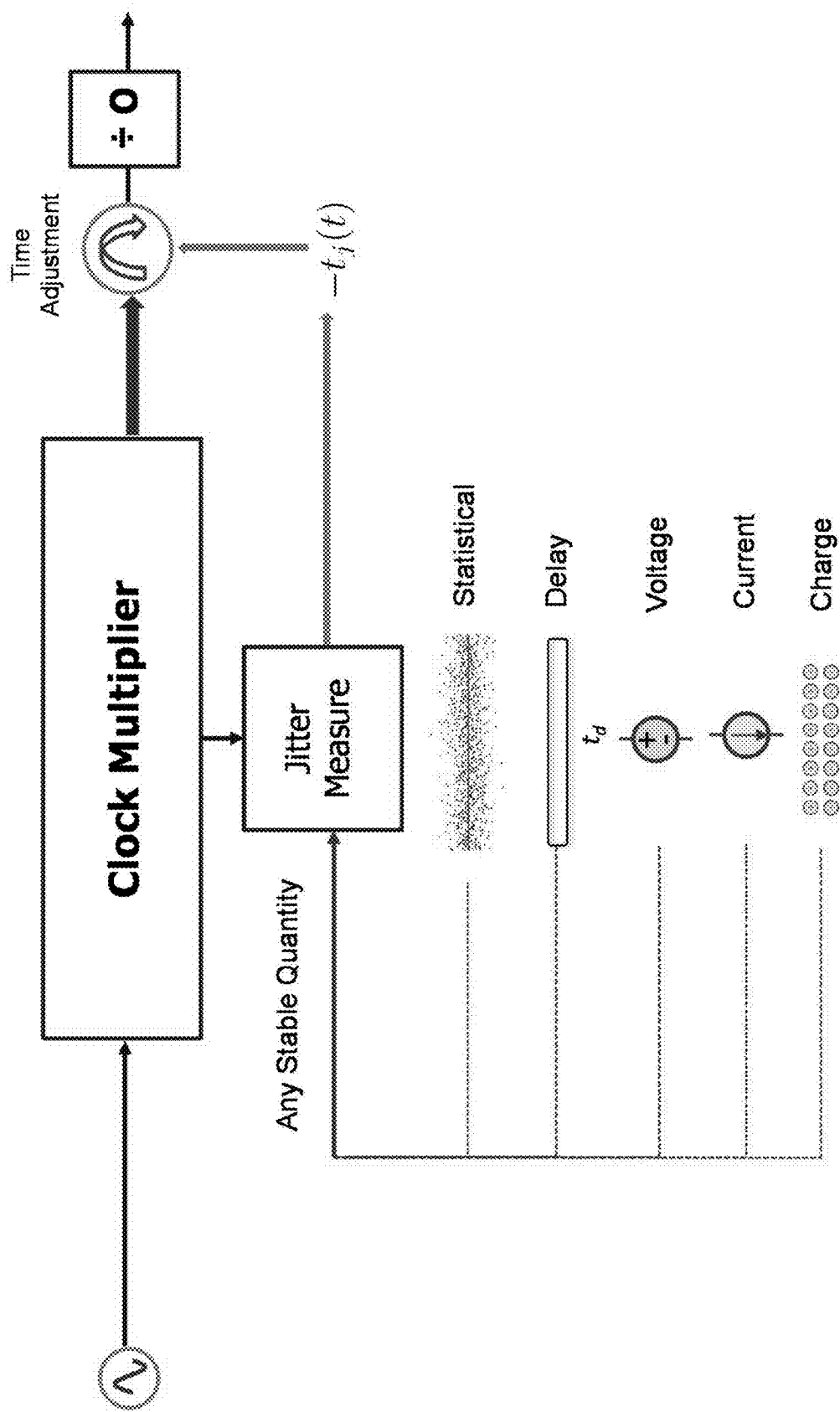
FIG. 12 is a simplified diagram illustrating a clock generator with forward compensation and references for jitter measurement according to embodiments of the present invention.

FIG. 12 is a simplified diagram illustrating a clock generator with forward compensation and references for jitter measurement according to embodiments of the present invention. This diagram is merely an example, which should not unduly limit the scope of the claims. One of ordinary skill in the art would recognize many variations, alternatives, and modifications. As illustrated in FIG. 12, various types of stable signals (providing a stable quantity) can be used as the reference. The stable signals can be a statistical signal, a stable delay, reference voltage, reference current, reference charge, and/or others.

Figure 13:
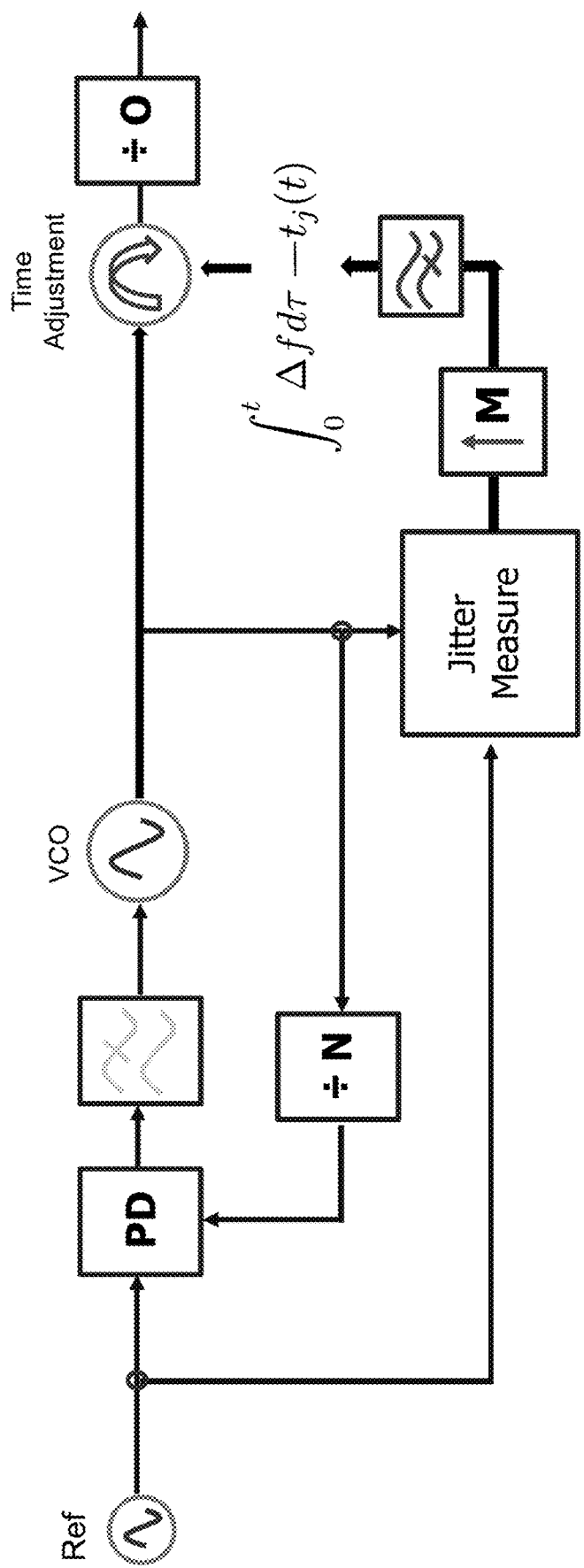
FIG. 13 is an exemplary clock generator with feedforward compensation according to an embodiment of the present invention.

FIG. 13 is an exemplary clock generator with feedforward compensation according to an embodiment of the present invention. This diagram is merely an example, which should not unduly limit the scope of the claims. One of ordinary skill in the art would recognize many variations, alternatives, and modifications. As shown in FIG. 13, an integer-N PLL is followed by a time adjustment block (e.g., it could be a calibrated phase interpolator) that generates phase noise compensation, and the time adjustment block also provide an offset expressed as $$\int_0^t \Delta f d\tau - t_j(t)$$

Figure 14:
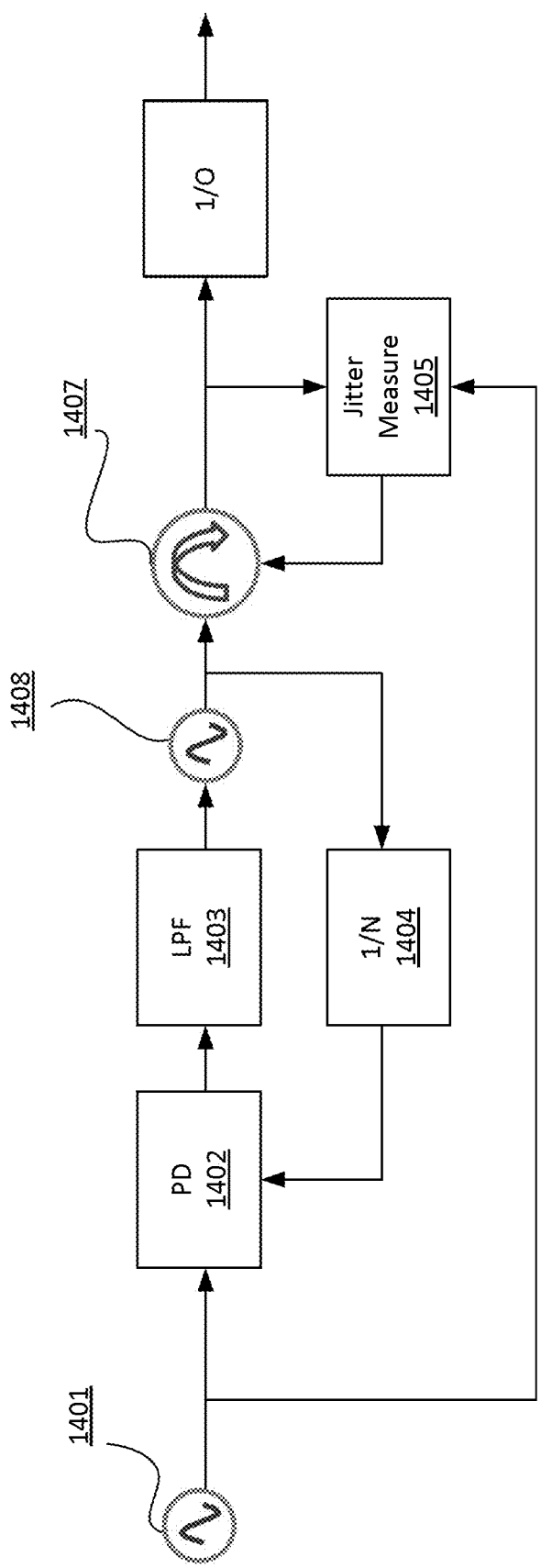
FIG. 14 is an exemplary clock generator with external loop compensation according to an embodiment of the present invention.

FIG. 14 is an exemplary clock generator with external loop compensation according to an embodiment of the present invention. This diagram is merely an example, which should not unduly limit the scope of the claims. One of ordinary skill in the art would recognize many variations, alternatives, and modifications. For example, reference clock signal (low frequency) is processed by the phase detection block 1402 and LPF block 1403. Output of the oscillator 1408 is provided to the "1/N" block 1404 and time adjustment block 1407. The jitter measurement block 1405 is implemented as a part of an external loop to provide compensation. Block 1405 uses output of oscillator 1401 as a reference for jitter measurement. For example, an integer-N PLL is followed by a phase-adjust block (up-sampling and filtering are not shown in FIG. 14).

Figure 15:
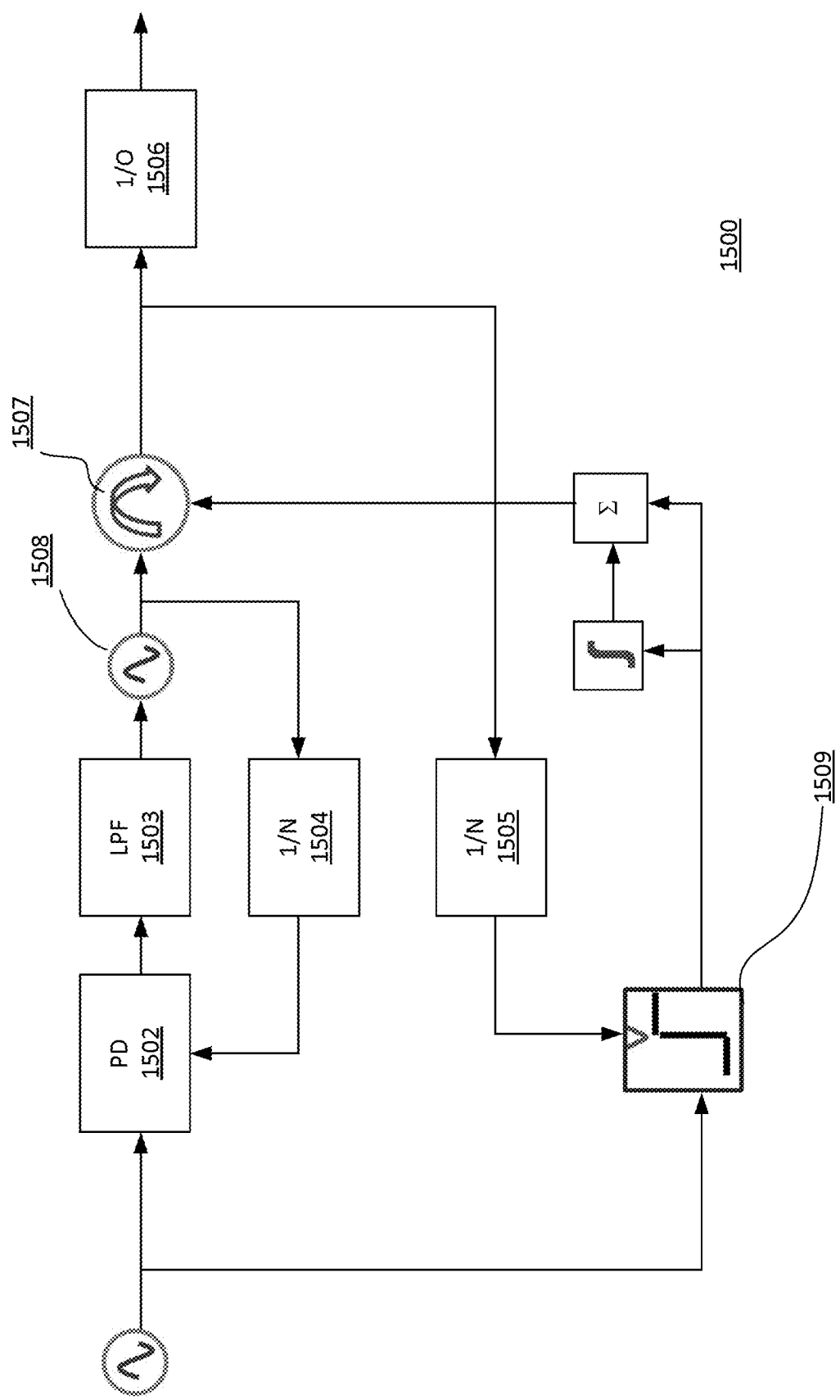
FIG. 15 is an exemplary clock generator with closed loop compensation according to an embodiment of the present invention.

FIG. 15 is an exemplary clock generator with closed loop compensation according to an embodiment of the present invention. This diagram is merely an example, which should not unduly limit the scope of the claims. One of ordinary skill in the art would recognize many variations, alternatives, and modifications. Clock generator 1500 includes two feedback loops. One of the feedback loop uses the output from oscillator 1508 and passes the signal to phase detector block 1502 through block 1504. The other loop passes the output signal of time adjustment block 1507 is processed by the block 1505 and 1509 to generates a time adjustment signal that is used by the time adjustment block 1507 to generate an output signal for block 1506. Jitter compensation is provided by the closed loops and the time adjustment block 1507.

Figure 16:
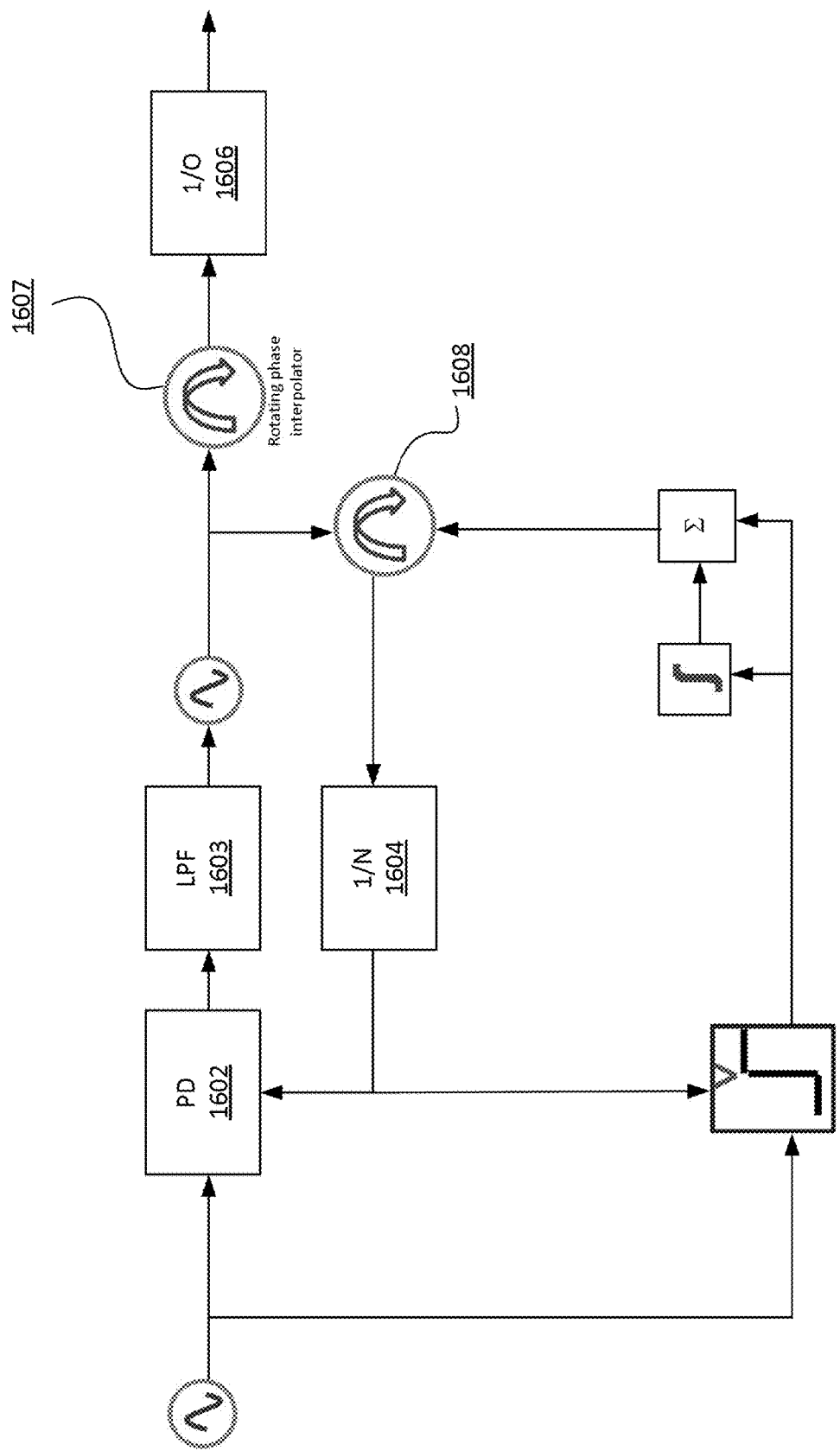
FIG. 16 is a simplified diagram illustrating a clock generator with coarse jitter compensation according to an embodiment of the present invention.

FIG. 16 is a simplified diagram illustrating a clock generator with coarse jitter compensation according to an embodiment of the present invention. This diagram is merely an example, which should not unduly limit the scope of the claims. One of ordinary skill in the art would recognize many variations, alternatives, and modifications. The clock generator 1600 implements an equivalent clock recovery situation with an external loop, where the clock samples the reference, and a phase-interpolator turns to make sure the VCO is centered on average. The feedforward path allows a frequency offset to be used. Time adjustment block 1607 provides output signal to block 1606. For example, time adjustment block 1607 includes a rotating phase interpolator. Time adjustment block 1608 is a part of a feedback loop that uses signal from the reference clock. For example, time adjustment block 1608 comprises a static phase interpolator.

Figure 17:
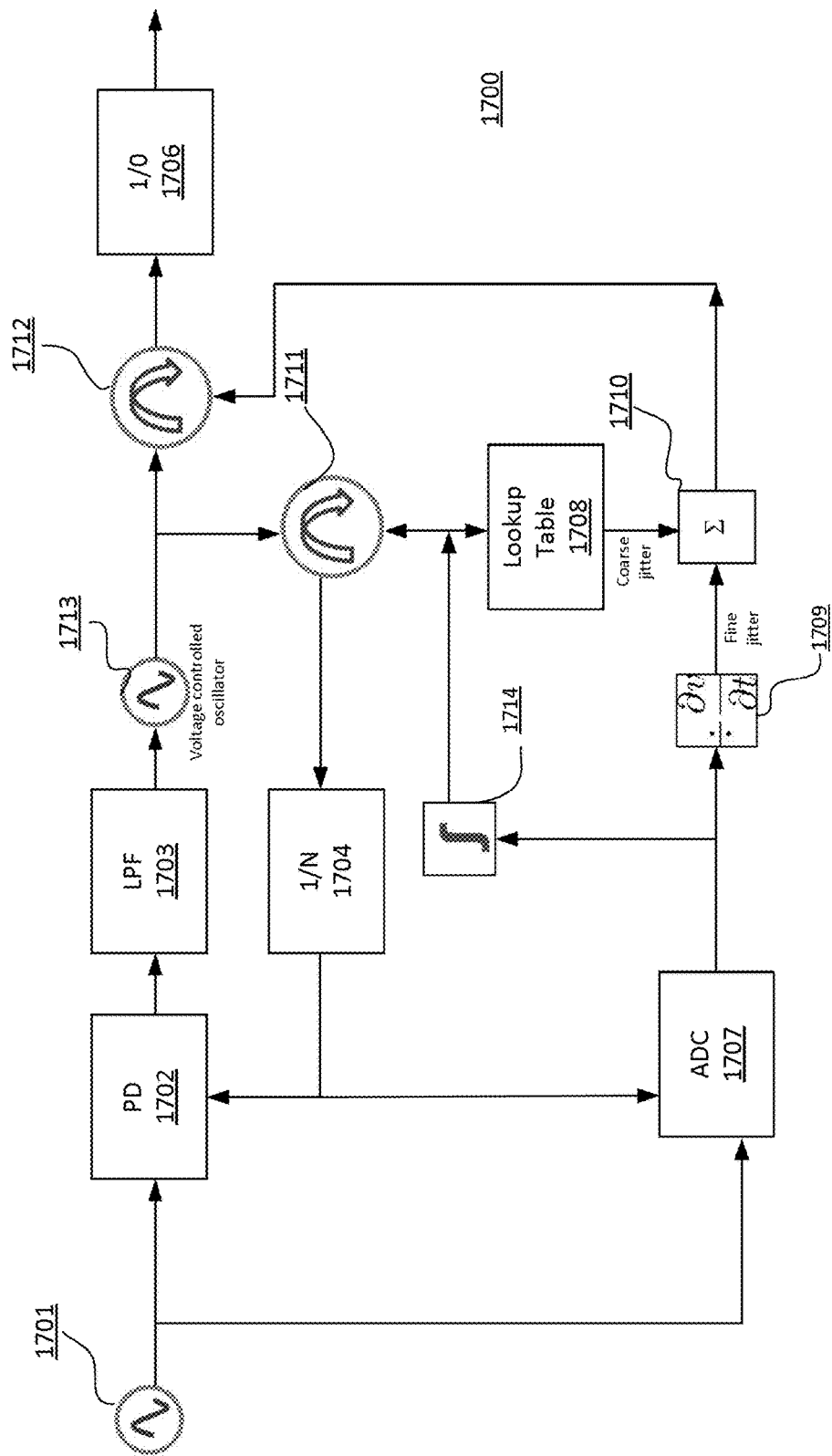
FIG. 17 is a simplified diagram illustrating a clock generator 1700 with fine jitter compensation according to an embodiment of the present invention.

FIG. 17 is a simplified diagram illustrating a clock generator 1700 with fine jitter compensation according to an embodiment of the present invention. This diagram is merely an example, which should not unduly limit the scope of the claims. One of ordinary skill in the art would recognize many variations, alternatives, and modifications. Reference signal from reference clock 1701 is processed by PD block 1702 and LPF block 1703. The output from VCO 1713 is processed by time adjustment blocks 1711 and 1712. In various embodiments, time adjustment block 1711 is implemented using a static phase interpolator, and time adjustment block 1712 is implemented using a rotating phase interpolator. For example, phase interpolators used for time adjustment blocks may be matched for optimized operation. Output from VCO 1713 is processed by time adjustment block 1711, and is then processed by "1/N" block 1704. The output of block 1704 is used both by PD block 1702 and ADC 1707. In various embodiments, ADC 1707 measures residual phase jitter with high accuracy (e.g., 50 ps rise time with 12-bit ADC gives 12 fs resolution). For example, ADC 1707 receives the reference clock signal with a fast edge at about 20 to 50 picoseconds. The errors measured by ADC 1707 are provided to lookup table (LUT) 1708 via block 1714. In various embodiments, LUT 1708 stores coarse jitter adjustment values that can be obtained using information received from time adjustment block 1711 and block 1714. Output from ADC 1707 is used by block 1709 to provided fine jitter adjustment values. Coarse and fine jitter adjustments values are summed up at block 1710, and the total jitter sampled at reference frequency is provided to time adjustment block 1712, which outputs a corrected signal. In various embodiments, errors measured by ADC 1707 can be applied in a delta sigma DAC configuration to the time adjustment block 1711 to compensate the output for the jitter of the VCO 1713.

Figure 18:
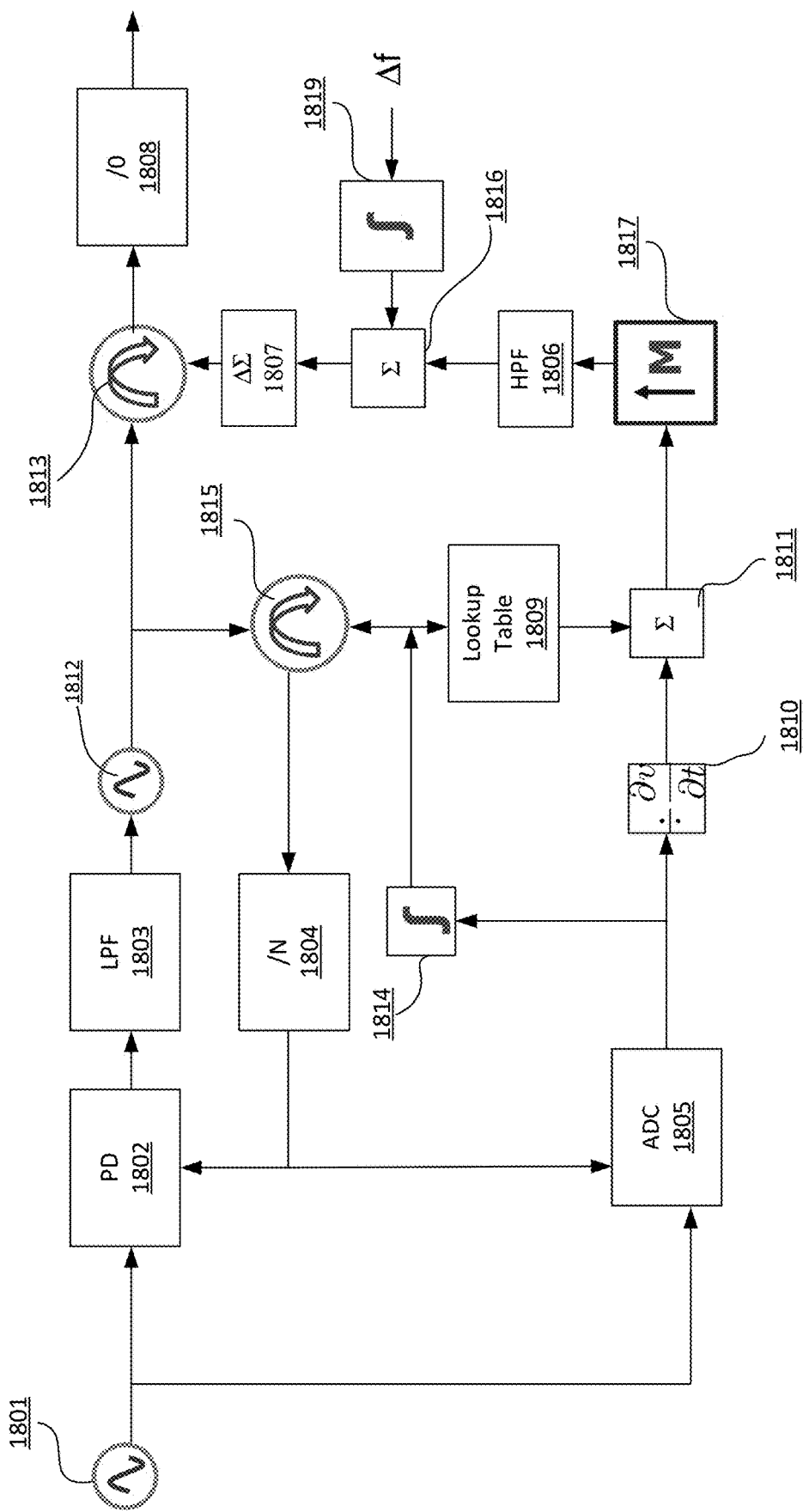
FIG. 18 is a simplified diagram illustrating a clock generator 1800 with jitter compensation and reference tracking compensation according to an embodiment of the present invention.

FIG. 18 is a simplified diagram illustrating a clock generator 1800 with jitter compensation and reference tracking compensation according to an embodiment of the present invention. This diagram is merely an example, which should not unduly limit the scope of the claims. One of ordinary skill in the art would recognize many variations, alternatives, and modifications. Clock generator 1800 is similar to clock generator 1700 in many ways, a main difference being the feedback signal used by the time adjustment block 1813. For example, time adjustment block 1813 is implemented using a rotating phase interpolator. The total jitter sampled at reference frequency $f_{ref}$ is further processed as shown before being used for adjustment at block 1813. A reference clock 1801 is input to a phase detector 1802 and an ADC 1805. An output of the phase detector 1802 is connected to a VCO 1812 via a low pass filter (LPF) 1803. An output of the VCO is connected to the time adjustment blocks 1813 and 1815. An output of the time adjustment block 1815 is connected to a "1/N" block 1804 and to a lookup table 1809. An output of the "1/N" block 1804 is connected to the phase detector 1802 and the ADC 1805. An output of the ADC 1805 is connected to the lookup table 1809 via a block 1814 and to a "÷∂v/∂t" block 1810. An output of the "÷∂v/∂t" block 1810 is connected to a summation block 1811. An output of the lookup table 1809 is connected to the summation block 1811. An output of the summation block 1811 is connected to a "↑M" block 1817. An output of the "↑M" block 1817 is connected to a high pass filter (HPF) 1806. An output of the HPF 1806 is connected to a summation block 1816. An input Δf is connected to a block 1819, and an output of the block 1819 is connected to the summation block 1816. An output of the summation block 1816 is connected to a "ΔΣ" block 1807. An output of the "ΔΣ" block 1807 is connected to the time adjustment block 1813. An output of the time adjustment block 1813 is connected to a "/O" block 1808.

Figure 19A:
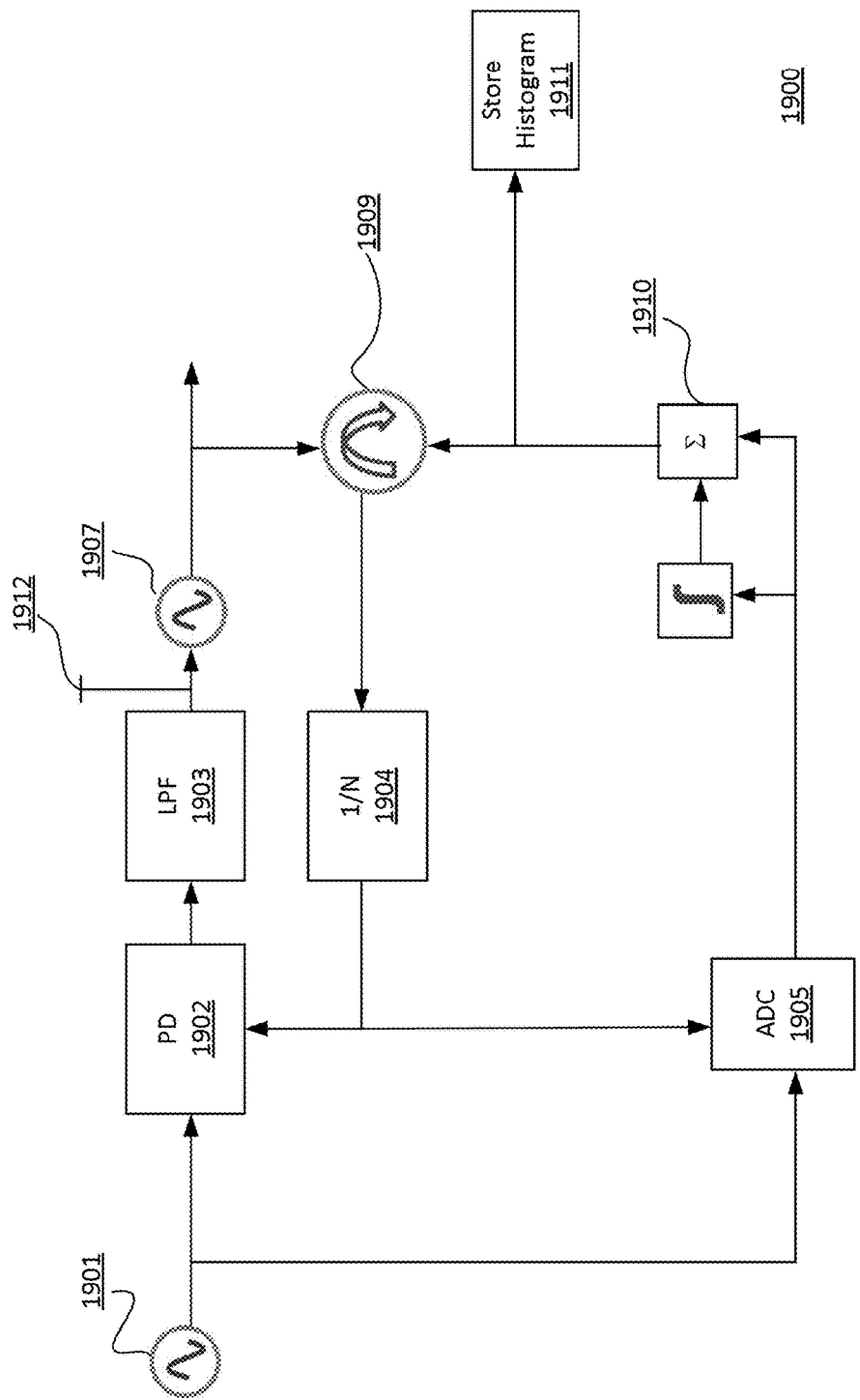
FIG. 19A is a simplified diagram illustrating clock signal generator 1900 calibration for phase interpolator according to embodiments of the present invention.
Figure 19B:
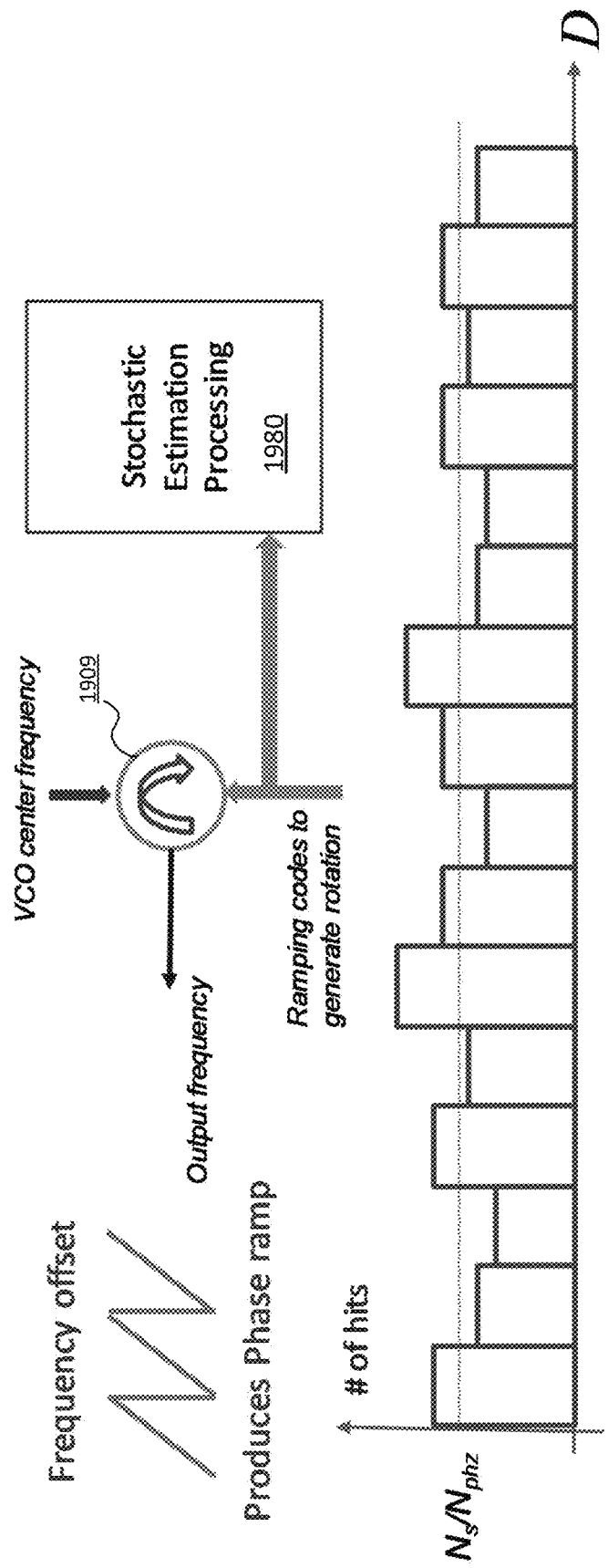
FIG. 19B is a simplified diagram illustrating a process for phase-interpolator calibration according to embodiments of the present invention.

FIG. 19A is a simplified diagram illustrating clock signal generator 1900 calibration for phase interpolator according to embodiments of the present invention. This diagram is merely an example, which should not unduly limit the scope of the claims. One of ordinary skill in the art would recognize many variations, alternatives, and modifications. Reference signal is provided by the reference clock 1901 to both PD block 1902 and ADC block 1905. As explained above, ADC block 1905 uses the reference signal for jitter compensation. In various embodiments, the reference signal is characterized by a fast edge of about 20 to 50 ps. The reference signal is processed at PD block 1902 and LPF block 1903. Node 1912 is positioned between LPF block 1903 and VCO 1907, and node 1912 provides a break loop point for calibration process. Output of VCO 1907 is provided to time adjustment block 1909. Time adjustment block 1909 is implemented with a phase interpolator, which needs to be calibrated. For example, adjustment block 1909 comprises a phase interpolator that rotates at a frequency based on VCO frequency $f_{VCO}$/N and reference frequency $f_{ref}$. The output of time adjustment block 1909 is provided to block 1911 to store the histogram. For example, the histogram is used to statistically estimate a bin width by a number of hits per bin, as illustrated in FIG. 19B and explained below. Similar to FIG. 18, jitter compensation is summed up at block 1910 and used by the time adjustment block 1909 for jitter compensation.

FIG. 19B is a simplified diagram illustrating a process for phase-interpolator calibration according to embodiments of the present invention. This diagram is merely an example, which should not unduly limit the scope of the claims. One of ordinary skill in the art would recognize many variations, alternatives, and modifications. As shown in FIG. 19B, time adjustment block 1909 receives VCO center frequency and ramping code as inputs, and it generates an output frequency. The ramping code is also used for the stochastic estimation processing block 1980. In various embodiments, block 1980 stores and uses histogram, where a phase interpolator (e.g., as a part of adjustment block 1909) rotates at Δf rate of $f_{VCO}$/N and $f_{ref}$. For example, block 1980 estimates bin width and stores errors in a lookup table. More specifically, block 1980 statistically estimates the bin width by the number of hits per bin, assuming the input has a known probability distribution (e.g., phase ramp). Additionally, a sufficient number of samples are needed for statistical accuracy. For example, an ideal signal is a linear ramp signal, which is easy to generate and comes naturally with frequency offset. This implementation is similar to DNL/INL code-density test, which involves determining the probability density function of a sinewave in the case of ADC testing. It is to be appreciated that jitter reduction largely depends on the reference signal. For example, actual jitter reduction is limited by the quality of the reference signal, and the difference between the VCO and the reference signal contributes to additive jitter.

Figure 20:
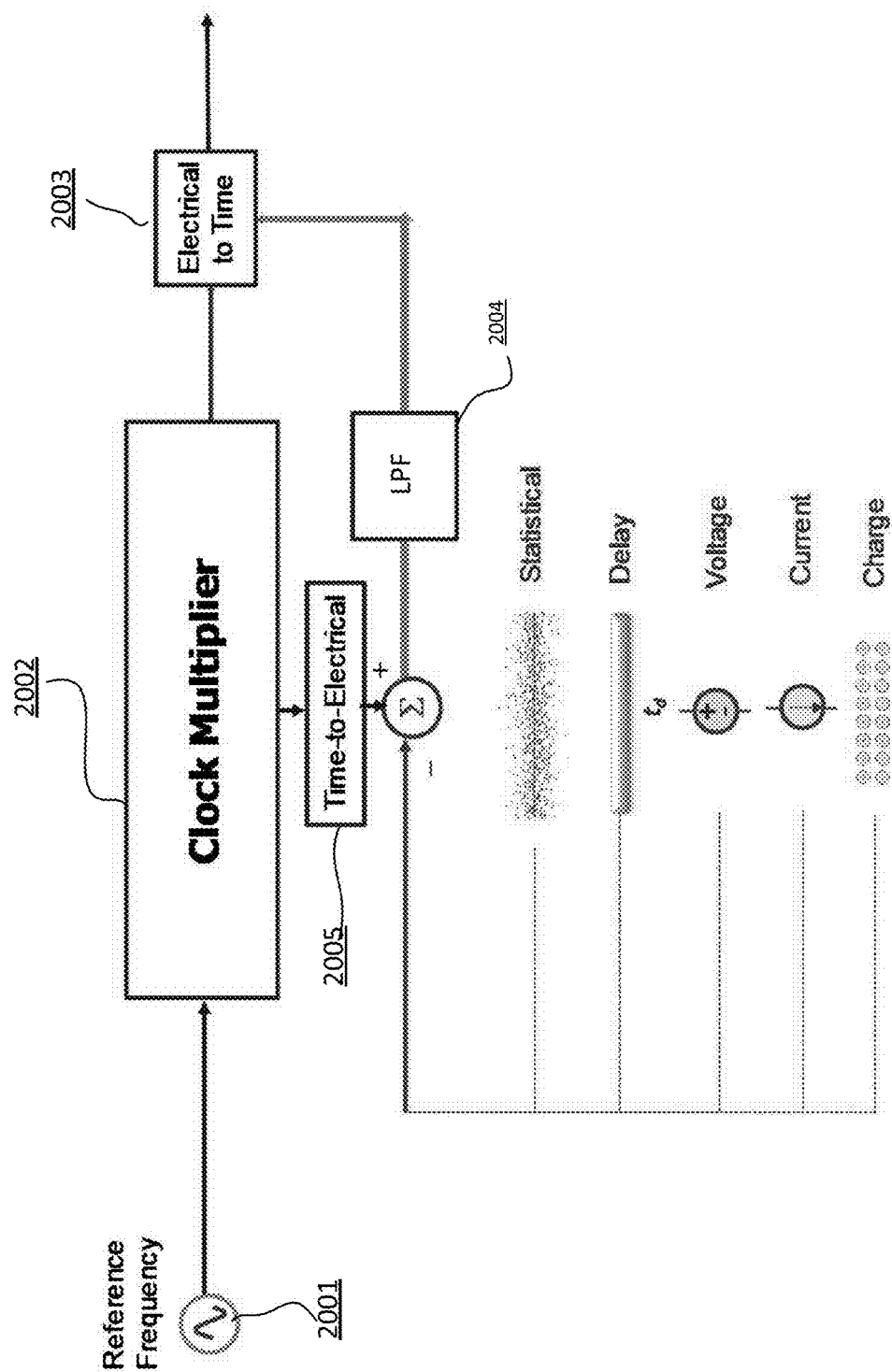
FIG. 20 is a simplified diagram illustrating a clock generator with a time-to-electrical module according to embodiments of the present invention.

FIG. 20 is a simplified diagram illustrating a clock generator with a time-to-electrical module according to embodiments of the present invention. This diagram is merely an example, which should not unduly limit the scope of the claims. One of ordinary skill in the art would recognize many variations, alternatives, and modifications. Reference signal provided by the reference frequency block 2001 is processed by clock multiplier 2002. Output of the clock multiplier 2002 is provided to both electrical to time block 2003 and time-to-electrical block 2005. Output of block 2005 is used for error correction, where one or more signals (e.g., statistical, delay, voltage, current, charge, etc.) may be used to provide jitter correction. The output of block 2005 is processed by the low-pass-filter 2004, and the filter signal is then provided to block 2003 for output. Depending on the implementation, different types of jitter measurement can be made. For example, jitter measurement can be made using Δ delay and phase detector, integrator compared to a reference voltage, or an edge-trigger charge pump.

Figure 21:
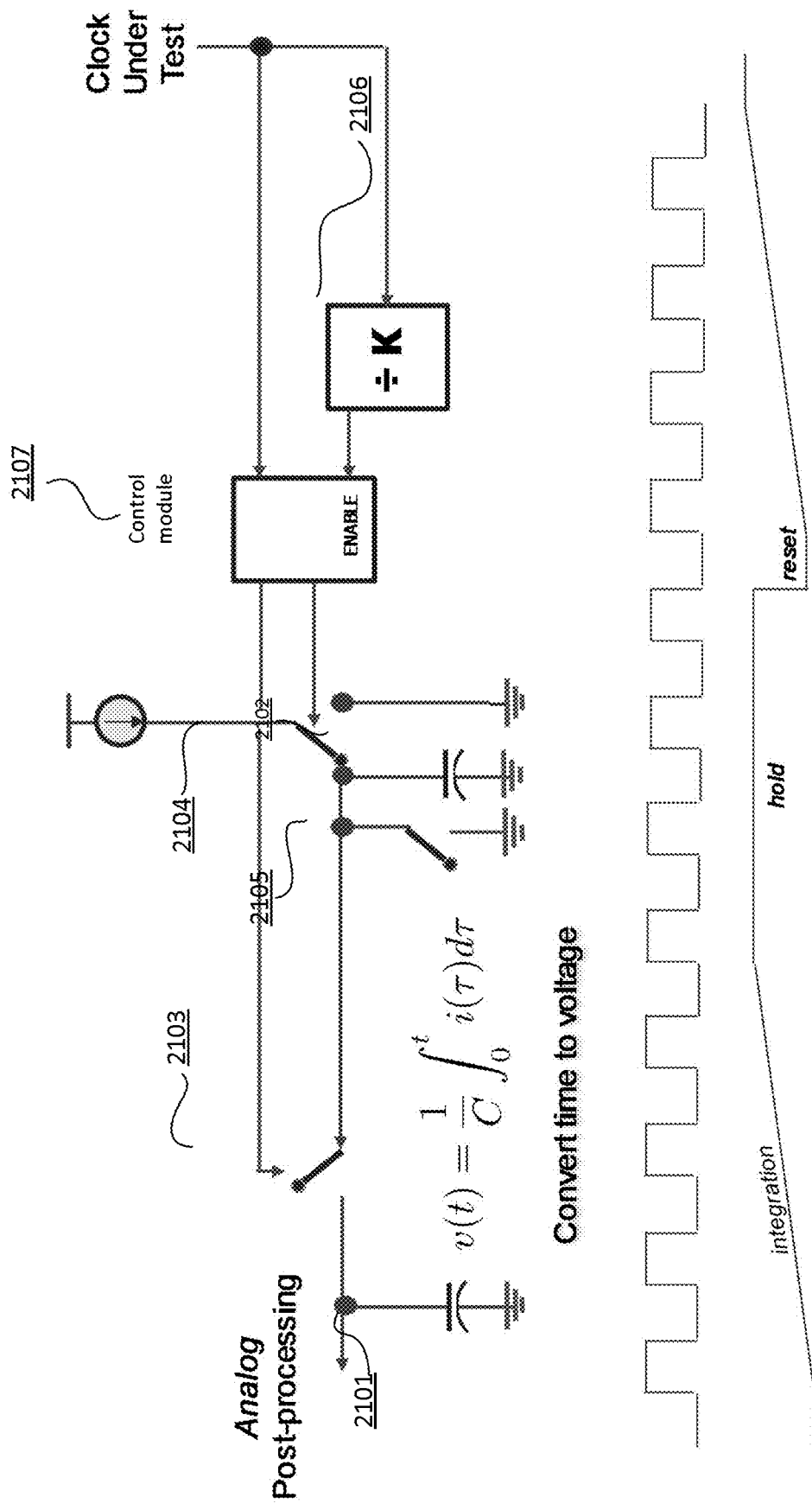
FIG. 21 is a simplified diagram illustrating clock generator with integration of time-to-voltage conversion according to embodiments of the present invention.

FIG. 21 is a simplified diagram illustrating clock generator with integration of time-to-voltage conversion according to embodiments of the present invention. This diagram is merely an example, which should not unduly limit the scope of the claims. One of ordinary skill in the art would recognize many variations, alternatives, and modifications. Analog signal for post processing is integrated at capacitor 2101 and capacitor 2002 (at different stages). Convert time to voltage is expressed using Equation 7 below:

$$v(t) = \frac{1}{C}\int_0^t i(\tau)d\tau \qquad \text{Equation 7}$$

The timing and signal processing are further provided by switches 2103, 2104, and 2105. Block 2107 provides control for signal pathway as which signals are processed. Block 2106 divides clock signal by a factor of "K" to reduce the speed requirement of the post-processing circuitry. It is to be appreciated that depending on the processing circuitry, K can be as low as "1" (i.e., no speed reduction) when fast measurement circuits are used.

Figure 22:
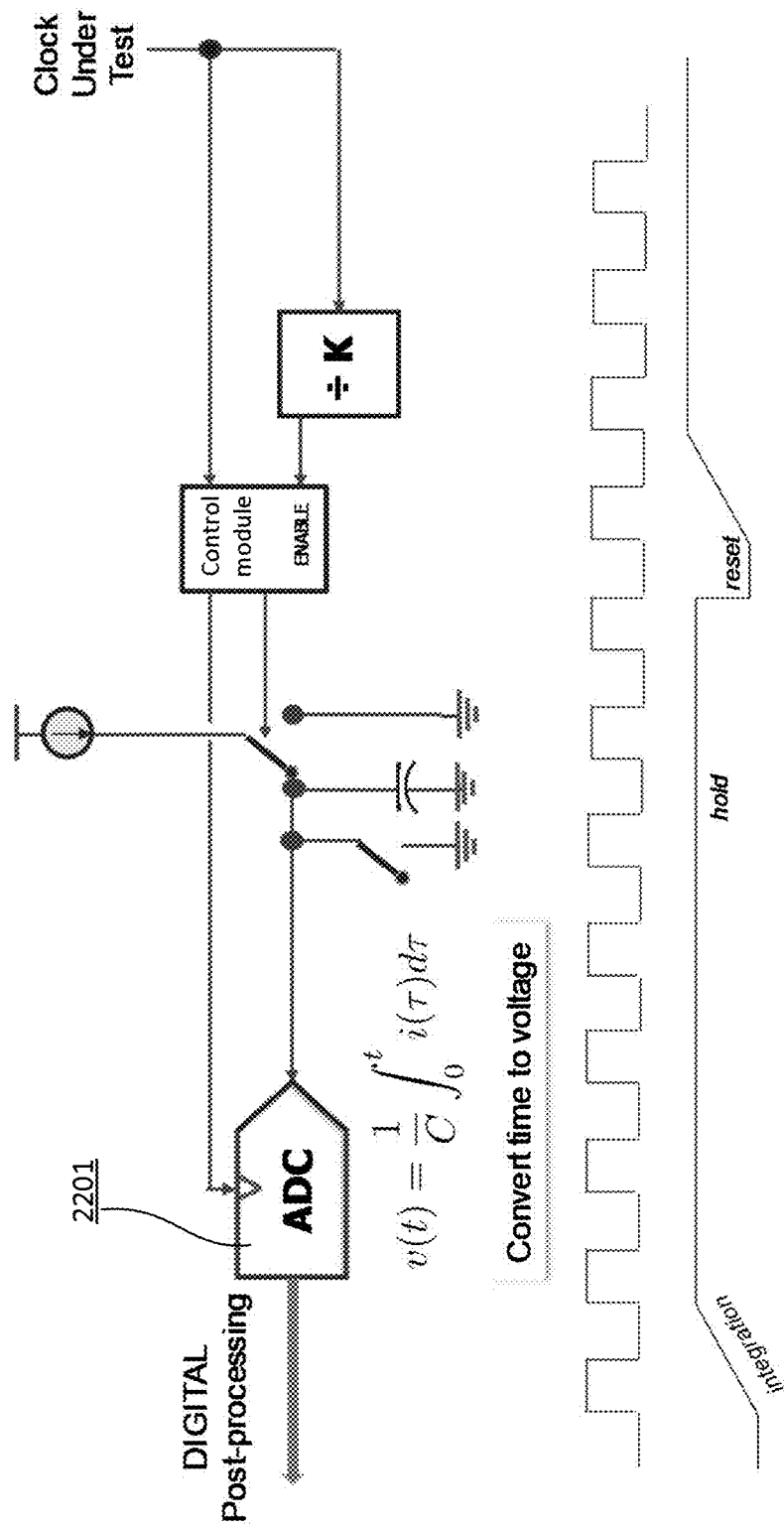
FIG. 22 is a simplified diagram illustrating clock generator with integration of time-to-voltage conversion with a digital loop according to embodiments of the present invention.

FIG. 22 is a simplified diagram illustrating clock generator with integration of time-to-voltage conversion with a digital loop according to embodiments of the present invention. This diagram is merely an example, which should not unduly limit the scope of the claims. One of ordinary skill in the art would recognize many variations, alternatives, and modifications. Digital output is provided by ADC 2201, and input clock signal ("clock under test") is divided by K. As can be seen in FIG. 22, the integration slope is steeper than the integration slope in FIG. 21. The resolution requirement is reduced for the implementation of ADC 2201. It is to be noted that a cycle of "integration", "hold", and "reset" is desired to be as fast as the output clock, but can take several cycles, so the sample rate of the ADC is less than the output clock by a factor of K. As mentioned above, the factor K can be as low as "1" if the sample rate of ADC is fast enough relative to the output clock.

Figure 23:
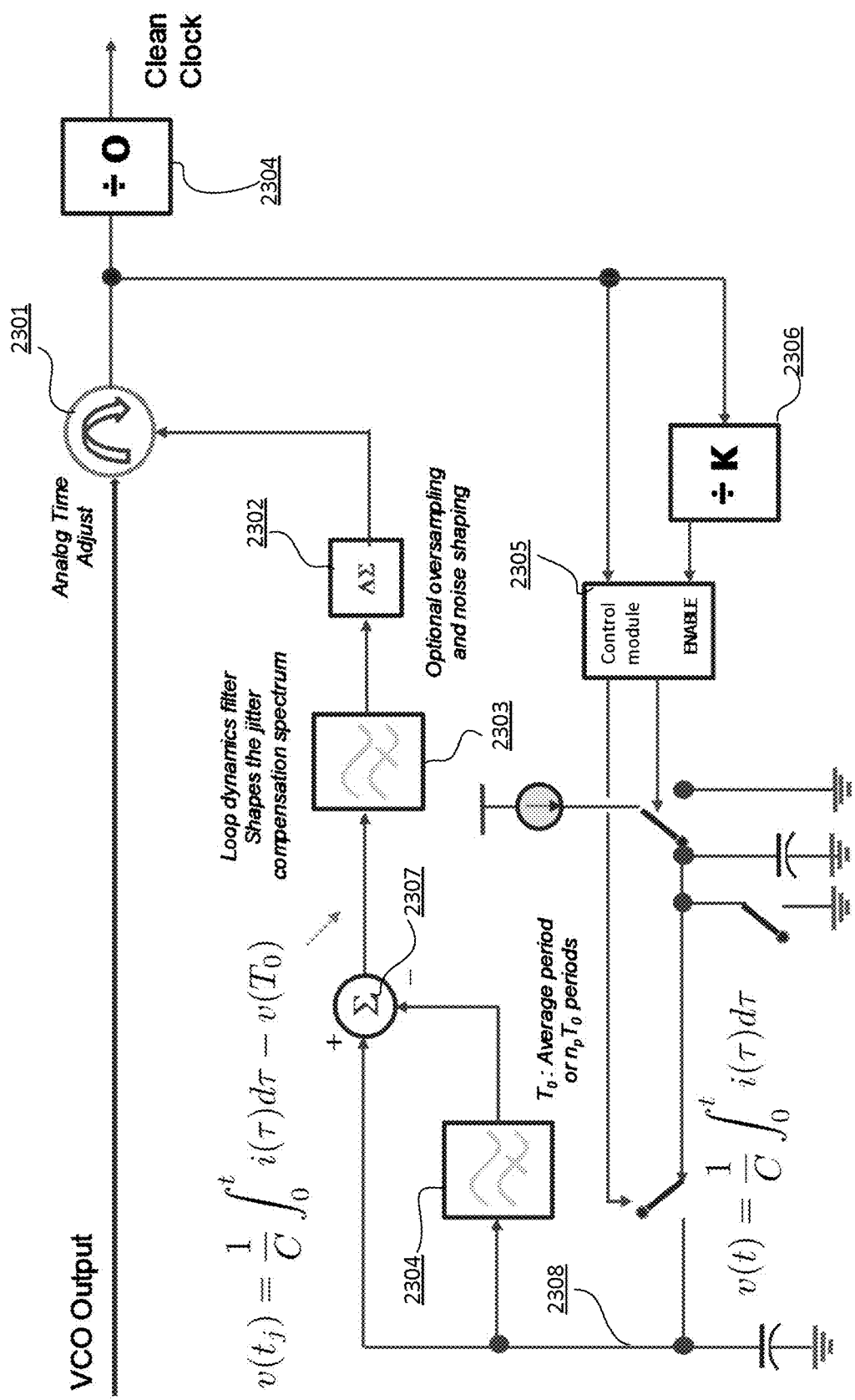
FIG. 23 is a simplified diagram illustrating a clock generator with an integrated time-to-voltage conversion according to embodiments of the present invention.

FIG. 23 is a simplified diagram illustrating a clock generator with an integrated time-to-voltage conversion according to embodiments of the present invention. This diagram is merely an example, which should not unduly limit the scope of the claims. The output of the time adjustment module 2301 is provided to output block 2304 for a clean output and to a feedback loop that starts with block 2305 and block 2306. As explained above, the output clock signal that is used for correction needs to be divided by a factor of K (at block 2306) to be low enough for the adjustment circuitry to process. In a specific implementation, K is at least 10. But it is understood that with fast adjustment circuitry, K can be as low as "1" in certain implementations. The divided signal is integrated, as explained above with Equation 7. The integrated signal (at node 2308) is provided to block 2307, which subtracts output of the high pass filter 2304. The output of block 2037 can be described by Equation 8 below:

$$v(t_j) = \frac{1}{C}\int_0^t i(\tau)d\tau - v(T_0) \quad \text{Equation 8}$$

A filter 2303 processes the output of block 2307. For example, filter 2303 comprises a dynamic loop filter that shapes the jitter compensation spectrum. The output of the filter 2303 is further processed by the ΔΣ block 2302, which provides an optional oversampling and noise shaping. The output of block 2302 is used by the time adjustment block 2301 to make adjustment to the output clock signal.

Figure 24:
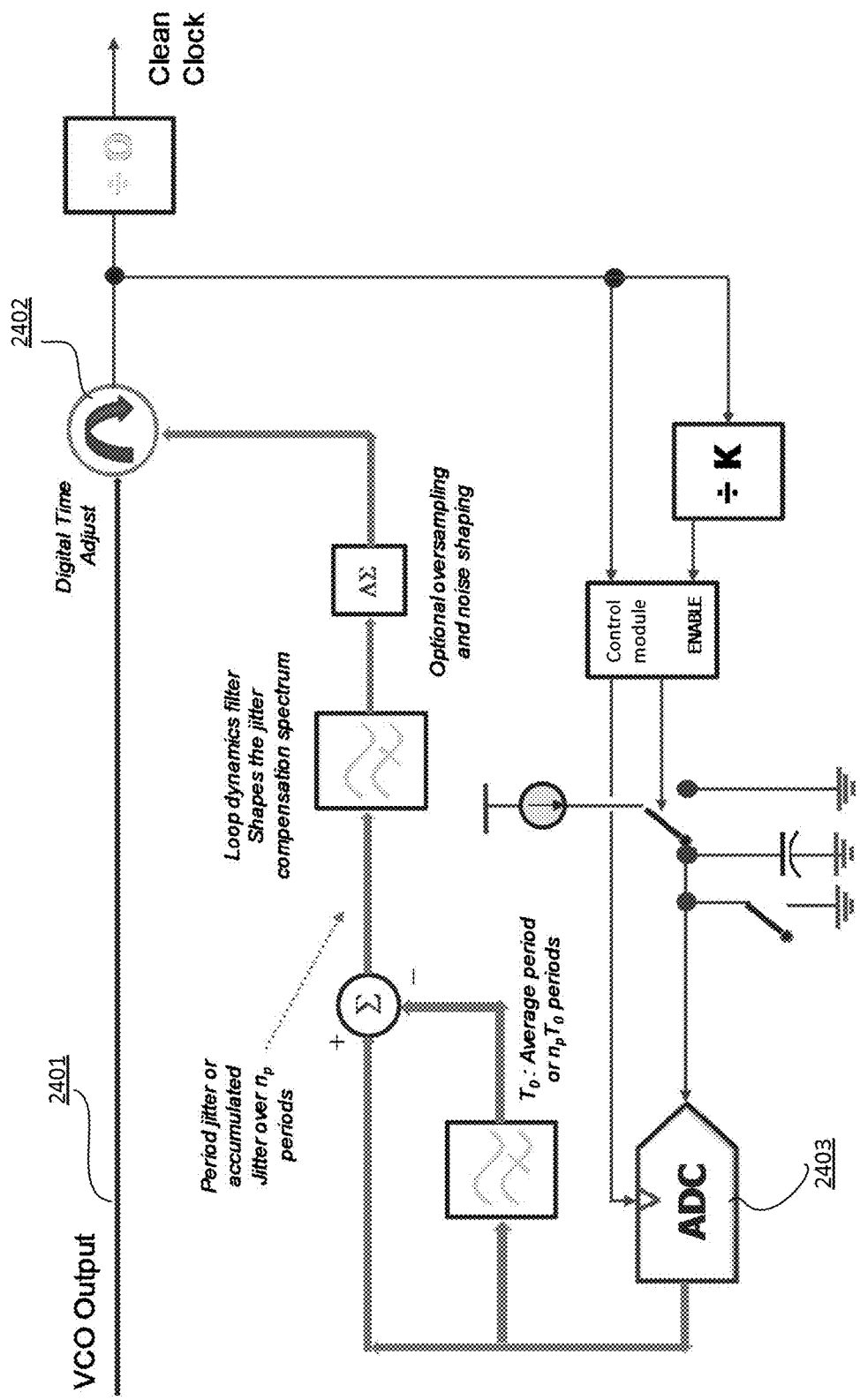
FIG. 24 is a simplified diagram illustrating a clock generator with an integrated time-to-voltage conversion and digital loop according to embodiments of the present invention.

FIG. 24 is a simplified diagram illustrating a clock generator with an integrated time-to-voltage conversion and digital loop according to embodiments of the present invention. This diagram is merely an example, which should not unduly limit the scope of the claims. Instead of analog signal used for determining compensation, ADC block 2403 as shown converts analog signal to digital for further processing. For example, the VCO output at terminal 2401 can operate at approximately an 8 GHz range (or a resolution of 125 ps). Time adjustment module 2402 can be implement with 7-bits with an update rate of about 2 GHz. For example, the time adjustment module 2402 is usually specified in a bandwidth of 12-kHz to 20 MHz. The ADC block 2403 can be implemented using a 12-bit ADC, a 10-bit ADC, or others.

Figure 25:
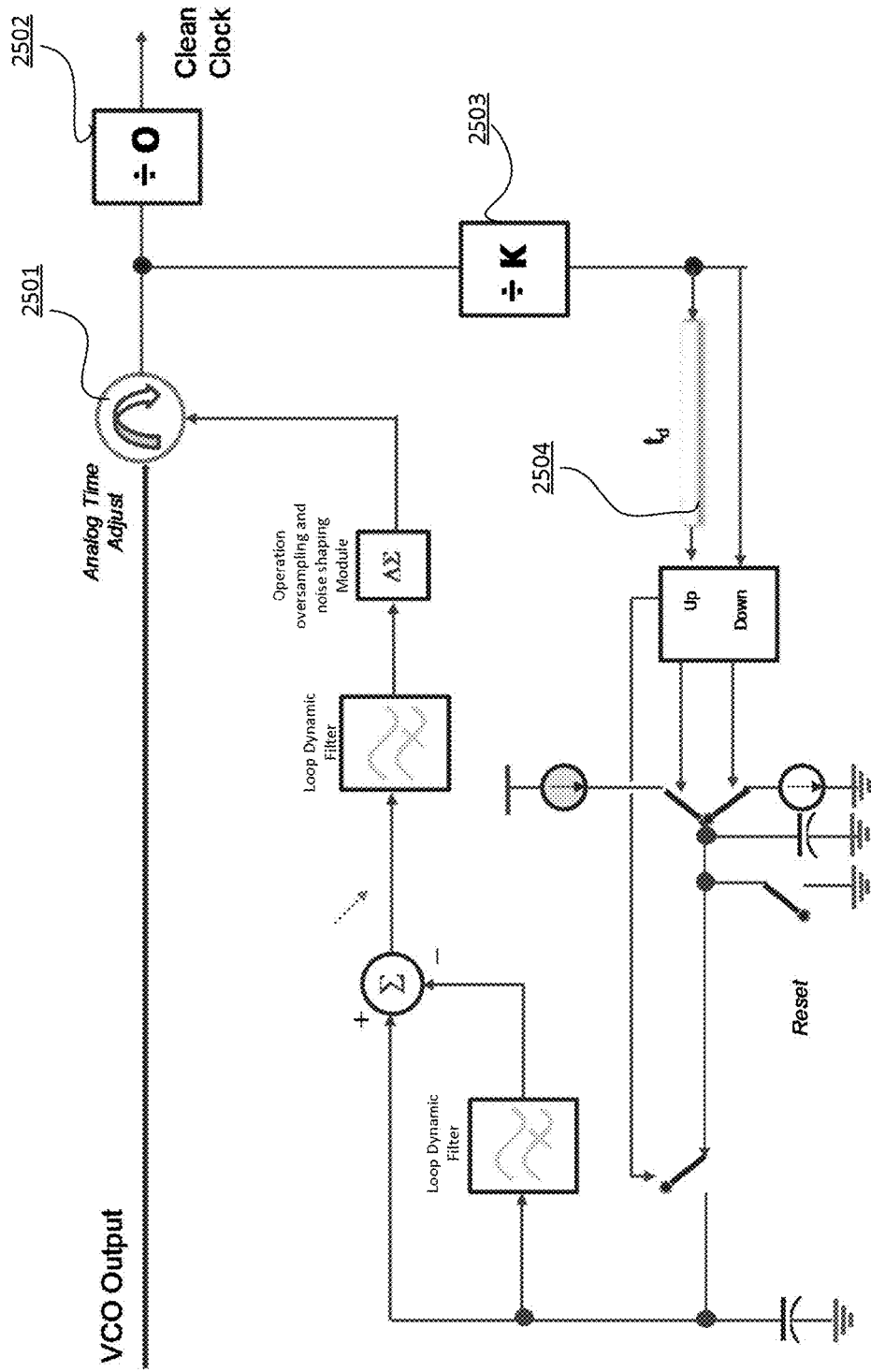
FIG. 25 is a simplified diagram illustrating a clock generator with a variable delay module according to embodiments of the present invention.

FIG. 25 is a simplified diagram illustrating a clock generator with a variable delay module according to embodiments of the present invention. This diagram is merely an example, which should not unduly limit the scope of the claims. A generated clock signal is provided to time adjustment block 2501 for adjustment. The output of time adjustment block 2501 is provided to both output block 2502 and block 2503. Block 2503 divides the received signal frequency by a factor of "K" for the purpose of matching the operating frequency of the post-processing circuitry. A variable delay block 2504 is used. For example, output of the delay block 2504 is used as a reference for determining jitter noise. In various implementations, the delay can be calibrated to 1-UI first. It is to be appreciated that the delay block 2504 can reduce the dynamic range needed in the jitter measurement, provided that the day $t_d$ is stable.

Figure 26:
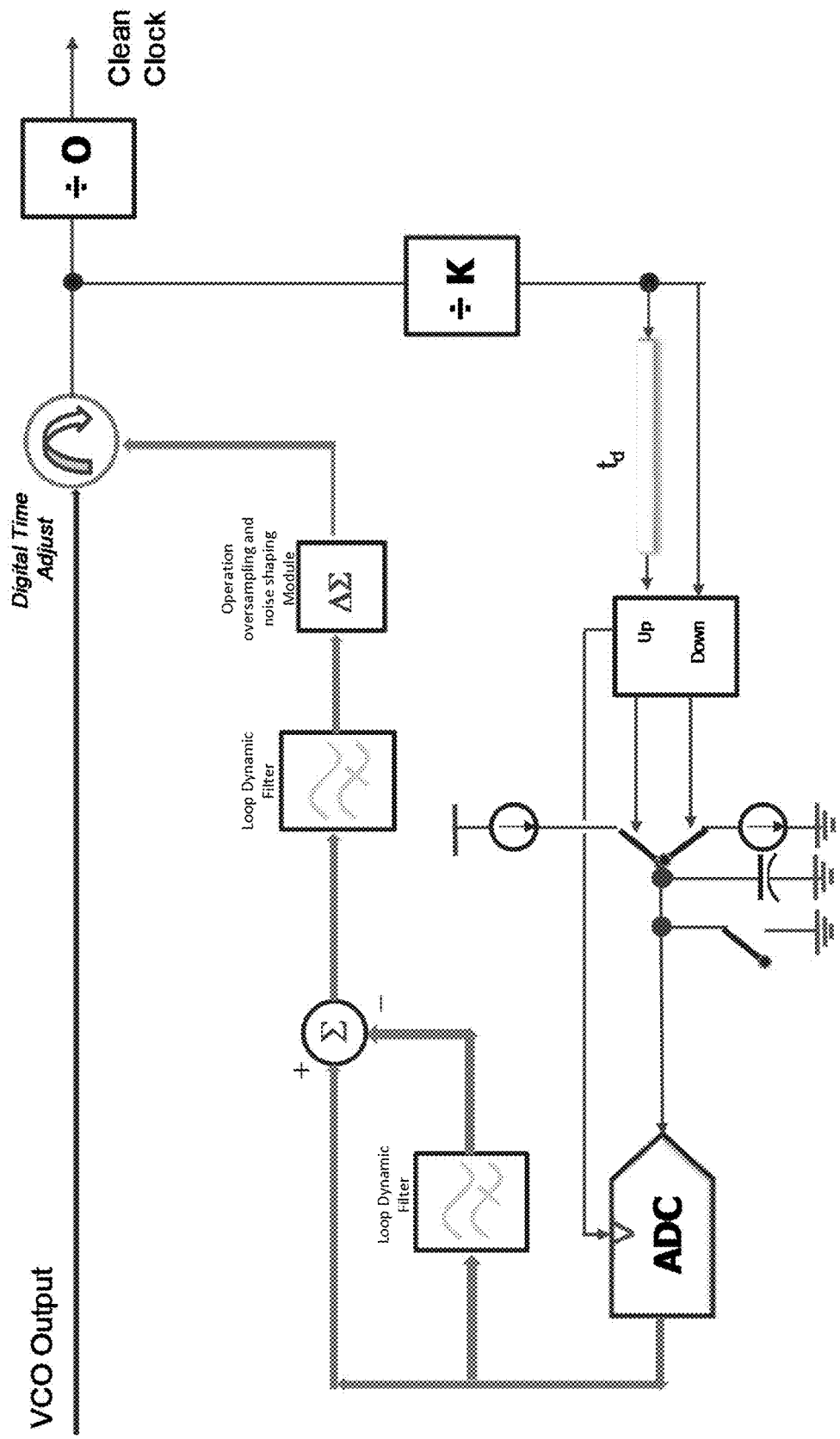
FIG. 26 is a simplified diagram illustrating a clock generator with a variable delay module and an ADC according to embodiments of the present invention.

FIG. 26 is a simplified diagram illustrating a clock generator with a variable delay module and an ADC according to embodiments of the present invention. This diagram is merely an example, which should not unduly limit the scope of the claims. In addition to the variable delay block 2504 illustrated in FIG. 25, the clock generator also includes an ADC as shown.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A clock generator device comprising:
   a source clock configured to generate a reference clock signal;
   a clock multiplier configured to generate a multiplied clock signal on a feedback path by multiplying the reference clock signal by a factor;
   a jitter measurement circuit coupled to the clock multiplier and configured to generate a compensation signal on a second path by sampling jitter of the reference clock signal associated with the multiplied clock signal based on a jitter reference signal providing a stable reference for jitter reduction, the jitter measurement circuit being configured to operate at a lowered frequency, the lowered frequency being lower than a frequency of the multiplied clock signal, wherein the jitter measurement circuit comprises a coarse jitter measurement path and a fine measurement jitter path, the coarse and fine jitter measurements from the coarse and fine jitter measurement paths being summed for a total litter value indicative of jitter associated with the reference clock signal; and
   an adjustment circuit coupled to the clock multiplier and the jitter measurement circuit, the adjustment circuit being configured to generate a corrected signal based on the multiplied clock signal, the compensation signal, and the total jitter value.

2. The clock generator device of claim 1 further comprising an output circuit for processing the corrected signal and generating an output clock signal compensated for jitter.

3. The clock generator device of claim 1 wherein the jitter reference signal comprises a statistical signal providing the stable reference for jitter reduction.

4. The clock generator device of claim 1 wherein the jitter reference signal comprises a delay signal providing the stable reference for jitter reduction.

5. The clock generator device of claim 1 wherein the jitter reference signal comprises a reference voltage providing the stable reference for jitter reduction.

6. The clock generator device of claim 1 wherein the adjustment circuit comprises a first phase interpolator for rotating phase interpolation.

7. The clock generator device of claim 6 wherein the adjustment circuit comprises a second phase interpolator for static phase interpolation, the second phase interpolator matching the first phase interpolator.

8. A clock generator device comprising:
   a source clock configured to generate a reference clock signal;

a clock multiplier configured to generate a multiplied clock signal on a feedback path by multiplying the reference clock signal by a factor; and an adjustment circuit coupled to the clock multiplier and a jitter measurement circuit, the adjustment circuit configured to generate a corrected signal based on the multiplied clock signal, a compensation signal, and a total jitter value indicative of jitter associated with the reference clock signal;

wherein the jitter measurement circuit comprises a lookup table on a second path for jitter adjustment and is configured to generate the compensation signal by sampling jitter of the reference clock signal associated with the multiplied clock signal based on a jitter reference signal providing a stable reference for jitter reduction, the jitter measurement circuit being configured to operate at a lowered frequency, the lowered frequency being lower than a frequency of the multiplied clock signal, and wherein the jitter measurement circuit further comprises a coarse jitter measurement path and a fine measurement jitter path on the second path, the coarse and fine jitter measurements from the coarse and fine litter measurement paths being summed for the total jitter value.

9. The clock generator device of claim 8 further comprising an output circuit for processing the corrected signal and generating an output clock signal compensated for jitter.

10. The clock generator device of claim 8 wherein the jitter reference signal comprises a statistical signal, a delay signal, or a reference voltage providing the stable reference for jitter reduction.

11. The clock generator device of claim 8 wherein the adjustment circuit comprises a first phase interpolator for rotating phase interpolation.

12. The clock generator device of claim 11 wherein the adjustment circuit comprises a second phase interpolator for static phase interpolation, the second phase interpolator matching the first phase interpolator.

13. A clock generator device comprising:

a source clock configured to generate a reference clock signal;

a clock multiplier configured to generate a multiplier clock signal on a feedback path by multiplying the reference clock signal by a factor, the clock multiplier being configured to remove phase noise in the reference clock signal;

a jitter measurement circuit coupled to the clock multiplier and configured to generate a compensation signal on a second path by sampling jitter of the reference clock signal associated with the multiplied clock signal based on a jitter reference signal providing a stable reference for jitter reduction, the measurement circuit being configured to operate at a lowered frequency relative to a frequency of the multiplied clock signal, the jitter measurement circuit comprising a high-pass filter for removing jitter and comprising a coarse jitter measurement path and a fine fitter measurement path, the coarse and fine jitter measurements from the coarse and fine jitter measurement paths being summed for a total jitter value indicative of jitter associated with the reference clock signal; and an adjustment circuit coupled to the clock multiplier and the jitter measurement circuit, the adjustment circuit being configured to generate a corrected signal based on the multiplied clock signal, the compensation signal, and the total jitter value.

14. The clock generator device of claim 13 wherein the adjustment circuit comprises a first phase interpolator for rotating phase interpolation.

15. The clock generator device of claim 14 wherein the adjustment circuit comprises a second phase interpolator for static phase interpolation, the second phase interpolator matching the first phase interpolator.

16. The clock generator device of claim 13 further comprising an output circuit for processing the corrected signal and generating an output clock signal compensated for jitter.

17. The clock generator device of claim 13 wherein the jitter reference signal comprises a statistical signal, a delay signal, or a reference voltage providing the stable reference for jitter reduction.

* * * * *